(12) United States Patent
Tsuchi et al.

(10) Patent No.: US 7,459,967 B2
(45) Date of Patent: Dec. 2, 2008

(54) DIFFERENTIAL AMPLIFIER, DIGITAL-TO-ANALOG CONVERTER AND DISPLAY DEVICE

(75) Inventors: Hiroshi Tsuchi, Tokyo (JP); Masao Iriguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 102 days.

(21) Appl. No.: 11/535,381

(22) Filed: Sep. 26, 2006

(65) Prior Publication Data

US 2007/0070022 A1   Mar. 29, 2007

(30) Foreign Application Priority Data

Sep. 26, 2005   (JP)   ............... 2005-278525

(51) Int. Cl.
*H03F 1/02* (2006.01)
(52) U.S. Cl. ............... 330/9; 330/51; 330/253; 330/260
(58) Field of Classification Search .......... 330/9, 330/51, 253, 259, 260; 327/124, 307
See application file for complete search history.

(56) References Cited

U.S. PATENT DOCUMENTS

| 6,448,836 | B2 | 9/2002 | Kokubun et al. | |
| 6,586,990 | B2* | 7/2003 | Udo et al. | 330/9 |
| 6,946,905 | B2 | 9/2005 | Kokubun et al. | |
| 7,253,679 | B2* | 8/2007 | Nishimori | 330/9 |
| 2006/0238242 | A1* | 10/2006 | Tsuchi | 330/253 |

FOREIGN PATENT DOCUMENTS

| JP | 2003-168936 | 6/2003 |
| JP | 2001-292041 | 10/2004 |

* cited by examiner

*Primary Examiner*—Khanh V Nguyen
(74) *Attorney, Agent, or Firm*—Dickstein Shapiro LLP

(57) ABSTRACT

Disclosed is a multi-level output differential amplifier which includes a first differential pair; a second differential pair; a load circuit commonly connected to output pairs of the first and second differential pairs; first and second current sources for supplying current to the first and second differential pairs, respectively; an amplifier stage for receiving a common output signal of the first and second differential pairs and driving an output terminal by a charging or discharging operation; and a control circuit for controlling changeover of signal inputs to the first and second differential pairs. The data output period includes first and second time periods. In the first time period, a voltage at the output terminal and a reference voltage are applied to first and second differential inputs of the first differential pair; the output-terminal voltage and the reference voltage are stored in first and second capacitors, respectively, connected to the first and second differential inputs of the first differential pair; and first and second voltages are applied to first and second differential inputs of the second differential pair. In the second time period, the first and second differential inputs of the first differential pair are cut off from supply of the output-terminal voltage and supply of the reference voltage and are supplied with the voltages stored in the first and second capacitors, and the output-terminal voltage and a third voltage are applied to the first and second differential inputs of the second differential pair.

26 Claims, 24 Drawing Sheets

| LEVEL | V(T1) | V(T2) | V(T3) | D1.D0 |
|-------|-------|-------|-------|-------|
| Vo4   | Vb    | Va    | Vn+1  | 1.1   |
| Vo3   | Va    | Vb    | Vn+1  | 1.0   |
| Vo2   | Vb    | Va    | Vn    | 0.1   |
| Vo1   | Va    | Vb    | Vn    | 0.0   |

Von = V(T3) + {V(T1) − V(T2)}

| LEVEL | V(T1) | V(T2) | V(T3) | D1,D0 |
|---|---|---|---|---|
| Vo4 | Vn+1 | Vn | Vn+1 | 1,1 |
| Vo3 | Vn+1 | Vn | Vn | 1,0 |
| Vo2 | Vn | Vn+1 | Vn+1 | 0,1 |
| Vo1 | Vn | Vn+1 | Vn | 0,0 |

Von = V(T3) + {V(T1) − V(T2)}

| LEVEL | V(T1)=V(T3) | V(T2) | D1,D0 |
|---|---|---|---|
| Vo4 | Vn+1 | Vn | 1,1 |
| Vo3 | Vn+1 | Vn+1 | 1,0 |
| Vo2 | Vn | Vn | 0,1 |
| Vo1 | Vn | Vn+1 | 0,0 |

Von = V(T3) + {V(T1) − V(T2)}

※R1=Ra+Rb

DIFFERENTIAL AMPLIFIER, DIGITAL-TO-ANALOG CONVERTER AND DISPLAY DEVICE

FIELD OF THE INVENTION

This invention relates to a multi-level output differential amplifier, digital-to-analog converter and display device.

BACKGROUND OF THE INVENTION

Flat-panel displays such as liquid crystal displays have come into widespread use in recent years. FIG. 20 is a diagram illustrating the general structure of a data driver that outputs level voltages to the data lines of a display section based upon a video signal. As shown in FIG. 20, the data driver includes at least a grayscale voltage generating circuit 920, decoders (selecting circuits) 930 and buffer circuits 910. The grayscale voltage generating circuit 920 comprises a resistor string connected between power supplies VH and VL. Terminals (taps) of the resistor string output grayscale voltages that conform to the number of gray levels. Each decoder 930 receives the grayscale voltages and a digital video signal as inputs, selects a grayscale voltage that corresponds to the video digital signal and outputs the voltage to the respective buffer 910 circuit. The latter current-amplifies the grayscale voltage and outputs the amplified voltage to an output terminal. The output terminals of the buffer circuits 910 are connected to data lines of the display section. A decoder 930 and buffer circuit 910 are provided for every output, and the grayscale voltage generating circuit 920 is shared by all outputs. Further, employed as the video signal supplied to the decoders 930 is a video digital signal that has been processed by a data register, latch and level shifter (none of which are shown), etc.

Since it is required that a data driver perform driving without a variance in the driving grayscale voltage from one of the multiple data lines to the next, the buffer circuits 910 are required to produce an output voltage with high accuracy. Arrangements of the kind shown in FIGS. 21, 22 and 23 have been proposed as being well suited for use in buffer circuits (see Patent Documents 1 and 2, cited below).

FIG. 21 illustrates a differential amplifier circuit that is an offset-canceling amplifier having a function for suppressing output offset caused by element variance of the transistors that construct the circuit. This is disclosed in Patent Document 1, cited below. FIG. 24 is a timing chart illustrating the ON/OFF operation of switches in the circuits of FIGS. 21 to 23.

In terms of operation of the circuit illustrated in FIG. 21, which will be described with reference to the timing chart of FIG. 24, switches SW1 and SW3 are turned ON and switch SW2 is turned OFF in time period t1 of one data output period, as a result of which an input voltage Vin and an output voltage Vout are applied to an input pair of a differential pair (M3, M4) and an input voltage Vin is applied to an input pair of a differential pair (M5, M6). At this time the output voltage Vout is a voltage (Vin+Vf) that includes an offset voltage Vf and is stored in a capacitance element C1.

This is followed by time period t2, at which the switches SW1, SW3 are set in an OFF state and the switch SW2 is turned ON, the input voltage Vin and the voltage (Vin+Vf) that has been stored in the capacitance element C1 are applied to the input pair of a differential pair (M3, M4), respectively, and the input voltage Vin and output voltage Vout are applied to the input pair of a differential pair (M5, M6), respectively.

At this time a voltage identical with that in time period t1 is applied to the differential pair (M3, M4), which operates to hold the differential pair (M5, M6) also in a state identical with that in time period t1. Accordingly, the output voltage Vout in time period t2 becomes a voltage equal to the input voltage Vin and is stable. That is, the circuit arrangement illustrated in FIG. 21 is capable of canceling the output offset and of amplifying and outputting a voltage that is equal to the input voltage.

Further, the arrangement illustrated in FIG. 22 is obtained by modifying the arrangement of FIG. 21 in such a manner that the influence of power supply noise on the output voltage Vout can be suppressed. A capacitor C2, which forms a pair with capacitor C1, is connected to the gate of transistor M3 constituting a differential pair, and a switch SW6 is connected between the gate of transistor M3 and a terminal to which the input voltage Vin is supplied.

In terms of operation of the circuit illustrated in FIG. 22, which will be described with reference to the timing chart of FIG. 24, switches SW1, SW3 and SW6 are set in an ON state and switch SW2 is set in an OFF state in time period t1 of one data output, as a result of which input voltage Vin and output voltage Vout are applied to the input pair of differential pair (M3, M4) and input voltage Vin is applied to the input pair of differential pair (M5, M6). At this time the voltage (Vin+Vf) that includes an offset voltage Vf is stored in the capacitance element C1 and the input voltage Vin is stored in the capacitance element C2.

This is followed by time period t2, at which the switches SW1, SW3 and SW6 are set in an OFF state and the switch SW2 is set in an ON state, the voltages Vin and (Vin+Vf) that have been stored in the capacitance elements C2 and C1 are applied to the input pair of differential pair (M3, M4), respectively, and the input voltage Vin and output voltage Vout are applied to the input pair of differential pair (M5, M6), respectively. In a manner similar to that shown in FIG. 21, the circuit illustrated in FIG. 22 also is capable of canceling the output offset and of amplifying and outputting a voltage that is equal to the input voltage.

It should be noted that in the circuit illustrated in FIG. 22, the voltages that have been stored in the capacitance elements C2 and C1 are applied to the input pair of differential pair (M3, M4) in the time period t2. As a result, even if noise occurs in power supply VSS, the voltages stored in the capacitance elements C2 and C1 fluctuate in the same manner, whereby the effects of noise on the output voltage Vout can be suppressed. Accordingly, the arrangement of FIG. 22 makes possible a voltage output that is more accurate than that obtained with the arrangement of FIG. 21.

Further, the arrangement shown in FIG. 23 also is obtained by modifying the arrangement of FIG. 21. Here the modification is such that a reference voltage Vref is applied to the gate of transistor M3 constituting the input pair.

In terms of operation of the circuit illustrated in FIG. 23, which will be described with reference to the timing chart of FIG. 24, switches SW1, SW3 are set in an ON state and switch SW2 is set in an OFF state in time period t1 of one data output, as a result of which reference voltage Vref and output voltage Vout are applied to the input pair of differential pair (M3, M4), respectively, and input voltage Vin is applied to the input pair of differential pair (M5, M6). At this time the output voltage Vout is a voltage (Vref+Vf) that includes offset voltage Vf with respect to reference voltage Vref. This is stored in capacitance element C1.

This is followed by time period t2, at which the switches SW1, SW3, SW2 are set in an OFF state and the switch SW2 is set in an ON state, the reference voltage Vref and the voltage (Vref+Vf) that has been stored in the capacitance element C1 are applied to the input pair of differential pair (M3, M4), respectively, and the input voltage Vin and output voltage Vout are applied to the input pair of differential pair (M5, M6), respectively.

At this time a voltage identical with that in time period t1 is applied to the input pair of differential pair (M3, M4), which acts to hold the differential pair (M5, M6) also in a state identical with that in time period t1. Accordingly, the output voltage Vout in time period t2 becomes a voltage equal to the input voltage Vin and is stable. That is, the circuit arrangement illustrated in FIG. 23 is capable of canceling the output offset and of amplifying and outputting a voltage that is equal to the input voltage.

In accordance with Patent Document 2, the reference voltage Vref is set to an intermediate voltage in the output voltage range of the amplifying circuit, whereby the amount of fluctuation in the potential of output voltage Vout in time period t1 can be made less than that in the case of FIG. 21. As a result, time period t1, which is the time period in which preparations are made for canceling offset, can be curtailed and time period t2, in which highly accurate drive is performed, can be prolonged.

Patent Document 1:
Japanese Patent Kokai Publication No. JP-P2001-2920041A (FIGS. 1 and 8)
Patent Document 2:
Japanese Patent Kokai Publication No. JP-P2003-168936 (FIG. 1)

SUMMARY OF THE DISCLOSURE

Liquid crystal display devices are being developed to have greater number of levels of gray (a greater number of colors) and 64 grayscale levels (260,000 colors), 256 grayscale levels (16,800,000 colors) and 1024 grayscale levels (1,070,000,000 colors) are now being realized. As the number of grayscale levels thus increases, the voltage difference between grays diminishes and therefore an amplifier capable of producing highly accurate voltage outputs becomes necessary. In addition, the number of transistors for selecting grayscale voltages increases and so does decoder area.

The configuration of the conventional data driver illustrated in FIG. 20 is such that each buffer circuit 910 amplifies and outputs the selected grayscale voltage as is. The area of each decoder 930, therefore, increases with an increase in number of grayscale levels. Further, even if the offset canceling amplifiers illustrated in FIGS. 21, 22 and 23 are used in the buffer circuits 910, the problem of an increase in decoder area is unsolved although it is possible to produce highly accurate voltage outputs.

In order to solve this problem, a multi-level output amplifier that is capable of outputting a large number of output levels with a small number of input levels is required.

Accordingly, it is an object of the present invention to provide a multi-level output differential amplifier for producing a highly accurate voltage output with a reduced decoder area and suppressed influence from element variance and noise, a digital-to-analog converter and a display device that employ this amplifier.

Another object of the present invention is to provide a multi-level output differential amplifier capable of suppressing input capacitance and of operating at high speed, a digital-to-analog converter and a display device that employ this amplifier.

According to a first aspect of the present invention, the foregoing and other objects are attained by providing a differential amplifier comprising: an input differential stage that includes first and second differential pairs and a load circuit commonly connected to output pairs of the first and second differential pairs; an amplifier stage for receiving a common output signal of the first and second differential pairs and driving an output terminal by a charging or discharging operation; and a control circuit for controlling switching between at least two states, namely first state and second state.

In the first state, the output terminal is feedback-connected to first differential input of the first differential pair; a reference voltage is supplied to second differential input of the first differential pair; a voltage at the output terminal and the reference voltage supplied to the differential inputs of the first differential pair are stored in first and second capacitors connected to the first and second differential inputs of the first differential pair; and first and second voltages are supplied to first and second differential inputs, respectively, of the second differential pair; and in the second state, the output terminal is feedback-connected to the first differential input of the second differential pair; a third voltage is supplied to the second differential input of the second differential pair; the first and second differential inputs of the first differential pair are cut off from the output terminal and a supply terminal of the reference voltage, respectively; and voltages that have been stored in the first and second capacitors are supplied to the first and second differential inputs, respectively, of the first differential pair. In the present invention, it may be so arranged that the first and second states are selected alternatively in first and second time periods, respectively, of a data output period.

In the present invention, the reference voltage comprises the third voltage, and the control circuit is adapted to control switching among a third state and the first and second states, wherein the third state is a state in which: the voltage at the output terminal is feedback-input to the first differential input of each of the first and second differential pairs and the third voltage is supplied to the second differential input of each of the first and second differential pairs. In the present invention, it may be so arranged that the third, first and second states are selected alternatively in first, second and third time periods, respectively, of a data output period.

According to a second aspect of the present invention, the foregoing objects are attained by providing a differential amplifier comprising: an input differential stage that includes first and second differential pairs and a load circuit commonly connected to output pairs of the first and second differential pairs; an amplifier stage for receiving a common output signal of the first and second differential pairs and driving an output terminal by a charging or discharging operation; a control circuit for controlling signal input to differential inputs of the first differential pair and to differential inputs of the second differential pair; and first and second capacitors having one ends thereof connected to first and second differential inputs, respectively, of the first differential pair; wherein a data output period includes first and second time periods; and control is exercised by the control circuit in such a manner that:

in the first time period, a voltage at the output terminal and a reference voltage are supplied to the first and second differential inputs of the first differential pair; the voltage at the output terminal and the reference voltage are stored in the first and second capacitors, respectively; and first and second voltages are supplied to first and second differential inputs, respectively, of the second differential pair; and in the second time period, the first and second differential inputs of the first differential pair are placed in a state in which they are cut off from the voltage at the output terminal and cut off from supply of the reference voltage, and are supplied with voltages that have been stored in the first and second capacitors, respectively; and the first and second differential inputs of the second differential pair are supplied with the voltage at the output terminal and with a third voltage, respectively.

In the differential amplifier of the present invention, it may be so arranged that the control circuit includes: first and second switches connected between the first differential input of the second differential pair and a first terminal that supplies the first voltage, and the output terminal, respectively; a third switch connected between the first differential input of the first differential pair and the output terminal; fourth and fifth switches connected between the second differential input of the second differential pair and second and third terminals, respectively, that supply the second and third voltages, respectively; and a sixth switch connected between the second differential input of the first differential pair and a fourth terminal that supplies the reference voltage.

In the first time period, the second and fifth switches are set in an OFF state; the voltage at the output terminal and the reference voltage are supplied to the first and second differential inputs of the first differential pair via the third and sixth switches, respectively, which are in an ON state; and the first and second voltages are supplied to the first and second differential inputs of the second differential pair via the first and fourth switches, respectively, which are in an ON state; and in the second time period, the first, third, fourth and sixth switches are all set in an OFF state, and the voltage at the output terminal and the third voltage are supplied to the first and second differential inputs of the second differential pair via the second and fifth switches, respectively, which are in an ON state.

In the differential amplifier of the present invention, it may be so arranged that the reference voltage is made the third voltage and the data output period has a preparatory drive period that is earlier than the first time period; and in the preparatory drive period, the third voltage is supplied to the second differential inputs of the first and second differential pairs, and the voltage at the output terminal is fed back to the first differential inputs of the first and second differential pairs.

In the differential amplifier of the present invention, it may be so arranged that the control circuit includes: first and second switches connected between the first differential input of the second differential pair and a first terminal that supplies the first voltage, and the output terminal, respectively; a third switch connected between the first differential input of the first differential pair and the output terminal; fourth and fifth switches connected between the second differential input of the second differential pair and second and third terminals, respectively, that supply the second and third voltages, respectively; and a sixth switch connected between the second differential input of the first differential pair and a fourth terminal that supplies the reference voltage; wherein the reference voltage is made the third voltage; the data output period has a preparatory drive period that is earlier than the first time period.

In the preparatory drive period, the first and fourth switches are set in an OFF state; the third voltage is supplied to the second differential inputs of the first and second differential pairs via the sixth and fifth switches, respectively, which are in an ON state; and the voltage at the output terminal is fed back and supplied to the first differential inputs of the first and second differential pairs via the third and second switches, respectively, which are in an ON state;

in the first time period, the second and fifth switches are set in an OFF state; the voltage at the output terminal and the third voltage are supplied to the first and second differential inputs of the first differential pair via the third and sixth switches, respectively, which are in an ON state; and the first and second voltages are supplied to the first and second differential inputs of the second differential pair via the first and fourth switches, respectively, which are in an ON state; and in the second time period, the first, third, fourth and sixth switches are all set in an OFF state, and the voltage at the output terminal and the third voltage are supplied to the first and second differential inputs of the second differential pair via the second and fifth switches, respectively, which are in an ON state.

In the differential amplifier of the present invention, it may be so arranged that the data output period has a preparatory drive period that is earlier than the first time period; and in the preparatory drive period, the second capacitor is cut off from the second differential input of the first differential pair to which the reference voltage is supplied, and is short-circuited to the first capacitor and the voltage at the output terminal is stored in the first and second capacitors.

In the differential amplifier of the present invention, it may be so arranged that the control circuit includes: first and second switches connected between the first differential input of the second differential pair and a first terminal that supplies the first voltage, and the output terminal, respectively; a third switch connected between the first differential input of the first differential pair and the output terminal; fourth and fifth switches connected between the second differential input of the second differential pair and second and third terminals, respectively, that supply the second and third voltages, respectively; a sixth switch connected between the second differential input of the first differential pair and a fourth terminal that supplies the reference voltage; a seventh switch connected between the second differential input of the first differential pair and the first end of the second capacitor; and an eighth switch connected between the first end of the first capacitor and the first end of the second capacitor. The data output period has a preparatory drive period that is earlier than the first time period.

In the preparatory drive period, the second, fifth and seventh switches are set in an OFF state, the voltage at the output terminal is supplied to the first differential input of the first differential pair, the reference voltage is supplied to the second differential input of the first differential pair via the sixth switch, which is in an ON state, the first and second voltages are supplied to the first and second differential inputs of the second differential pair via the first and fourth switches, respectively; and the first end of the first capacitor and the first end of the second capacitor are supplied commonly with the voltage at the output terminal via the third and eighth switches, which are in an ON state;

in the first time period, the second, fifth and eighth switches are all set in an OFF state, and the second capacitor is connected to the second differential input of the first differential pair and is supplied with the reference voltage via the seventh switch, which is in an ON state; and in the second time period, the first, third, fourth and eighth switches are all set in an OFF state, and the voltage at the output terminal and the third voltage are supplied to the first and second differential inputs of the second differential pair via the second and fifth switches, respectively, which are in an ON state.

In the differential amplifier of the present invention, it may be so arranged that the reference voltage is made the third voltage and the data output period has a preparatory drive period that is earlier than the first time period; in the preparatory drive period, the third voltage is supplied to the second differential inputs of the first and second differential pairs; the voltage at the output terminal is fed back to the first differential inputs of the first and second differential pairs; the second capacitor is cut off from the second differential input of the first differential pair, which is supplied with the third voltage, and is short-circuited to the first capacitor; and the voltage at the output terminal is stored in the first and second capacitors.

In the differential amplifier of the present invention, it may be so arranged that the control circuit includes: first and second switches connected between the first differential input of the second differential pair and a first terminal that supplies the first voltage, and the output terminal, respectively; a third switch connected between the first differential input of the first differential pair and the output terminal; fourth and fifth switches connected between the second differential input of the second differential pair and second and third terminals, respectively, that supply the second and third voltages, respectively; a sixth switch connected between the second differential input of the first differential pair and a fourth terminal that supplies the reference voltage; a seventh switch connected between the second differential input of the first differential pair and the first end of the second capacitor; and an eighth switch connected between the first end of the first capacitor and the first end of the second capacitor. The reference voltage is made the third voltage. The data output period has a preparatory drive period that is earlier than the first time period.

In the preparatory drive period, the first, fourth and seventh switches are set in an OFF state; the voltage at the output terminal is fed back and supplied to the first differential inputs of the first and second differential pairs via the third and second switches, respectively, which are in an ON state; the third voltage is supplied to the second differential inputs of the first and second differential pairs via the sixth and fifth switches, respectively, which are in an ON state; and the voltage at the output terminal is supplied commonly to the first and second capacitors via the third and eighth switches, which are in an ON state;

in the first time period, the second, fifth and eighth switches are all set in an OFF state; the voltage at the output terminal and the third voltage are supplied the first and second differential inputs of the first differential pair via the third and sixth switches, which are in an ON state; the first and second voltages are supplied to the first and second differential inputs of the second differential pair via the first and fourth switches, respectively, which are in an ON state; the second capacitor is connected to the second differential input of the first differential pair and is supplied with the third voltage via the seventh switch, which is in an ON state; and in the second time period, the first, third, fourth and eighth switches are all set in an OFF state, and the voltage at the output terminal and the third voltage are supplied to the first and second differential inputs of the second differential pair via the second and fifth switches, respectively, which are in an ON state.

The differential amplifier of the present invention may further comprise a ninth switch, which is set in an ON state, connected between the first differential input of the first differential pair and the first end of the first capacitor.

In the differential amplifier of the present invention, the amplifier stage comprises a differential amplifying circuit having an input pair connected to first and second common connection nodes of output pairs of the first and second differential pairs, and an output end connected to the output terminal.

According to a third aspect of the present invention, the foregoing objects are attained by providing a differential amplifier comprising: first and second differential pairs of a first polarity; a first load circuit of a second polarity commonly connected to the first and second differential pairs; first and second current sources for supplying current to the first and second differential pairs, respectively; third and fourth differential pairs of the second polarity; a second load circuit of the first polarity commonly connected to the third and fourth differential pairs; third and fourth current sources for supplying current to the third and fourth differential pairs, respectively; a first amplifier stage for receiving a common output signal of the first and second differential pairs and having an output connected to an output terminal; a second amplifier stage for receiving a common output signal of the third and fourth differential pairs and having an output connected to the output terminal; a control circuit for controlling signal input to the first to fourth differential pairs; first and second differential inputs of the first differential pair being connected to first and second differential inputs of the third differential pair, respectively; first and second differential inputs of the second differential pair being connected to first and second differential inputs of the fourth differential pair, respectively; and first and second capacitors having first ends connected to first and second common connection nodes, respectively, of the first and second differential inputs of the first and third differential pairs. The data output period includes first and second time periods.

In the first time period, a voltage at the output terminal and a reference voltage are supplied to the first and second differential inputs of the first and third differential pairs; the voltage at the output terminal and the reference voltage are stored in the first and second capacitors connected to the first and second differential inputs of the first and third differential pairs; and first and second voltages are supplied to the first and second differential inputs of the second and fourth differential pairs; and in the second time period, the first and second differential inputs of the first and third differential pairs are cut off from supply of the voltage at the output terminal and of the reference voltage, and are supplied with voltages that have been stored in the first and second capacitors, respectively; and the first and second differential inputs of the second and fourth differential pairs are supplied with the voltage at the output terminal and with a third voltage.

In the differential amplifier of the present invention, an arrangement may be adopted in which the control circuit includes: first to sixth switches, wherein the first and second switches are connected between a third common connection node of the first differential inputs of the second and fourth differential pairs and a first terminal that supplies the first voltage, and the output terminal, respectively; the third switch is connected between the first common connection node of the first differential inputs of the first and third differential pairs and the output terminal, respectively; the fourth and fifth switches are connected between a fourth common connection node of the second differential inputs of the second and fourth differential pairs and second and third terminals, respectively, which supply the second and third voltages, respectively; and the sixth switch is connected between the second common connection node of the second differential inputs of the first and third differential pairs and a fourth terminal that supplies the reference voltage.

In the first time period, the second and fifth switches are set in an OFF state; the voltage at the output terminal and the reference voltage are supplied to the first and second differential inputs of the first and third differential pairs via the third and sixth switches, respectively, which are in an ON state; and the first and second voltages are supplied to the first and second differential inputs of the second and fourth differential pairs via the first and fourth switches, respectively, which are in an ON state; and in the second time period, the first, third, fourth and sixth switches are all set in an OFF state, and the voltage at the output terminal and the third voltage are supplied to the first and second differential inputs of the second and fourth differential pairs via the second and fifth switches, respectively, which are in an ON state.

In the differential amplifier of the present invention, it may be so arranged that the reference voltage comprises any one of the first, second and third voltages in the data output period.

In the differential amplifier of the present invention, it may be so arranged that the voltage at the output terminal in the second time period is a voltage obtained by adding or subtracting a difference voltage between the first and second voltage to or from the third voltage.

In the differential amplifier of the present invention, it may be so arranged that the third voltage comprises the first or second voltage in the data output period.

According to a fourth aspect of the present invention, the foregoing objects are attained by providing a digital-to-analog converter comprising: a differential amplifier in accordance with the present invention described above; a group of resistors connected serially between a first potential on a high potential side and a second potential on a low potential side for outputting m-number of level voltages and first and second reference voltages from taps thereof; and a decoder for selecting the first and second voltages from the first and second reference voltages and the third voltage from the m-number of level voltages based upon a data signal, and supplying the first, second and third voltages to the differential amplifier.

According to a fifth aspect of the present invention, the foregoing objects are attained by providing a digital-to-analog converter comprising: a differential amplifier in accordance with the present invention described above; a group of resistors connected serially between a first potential on a high potential side and a second potential on a low potential side for outputting m-number of level voltages from taps thereof; and a decoder for selecting the first, second and third voltages from the m-number of level voltages based upon a data signal, and supplying the first, second and third voltages to the differential amplifier. The third voltage comprises the first or second voltage.

According to a sixth aspect of the present invention, there is provided a data driver comprising a plurality of the digital-to-analog converters, wherein voltages that are output from the group of resistors and taps are shared by the plurality of digital-to-analog converters.

According to a seventh aspect of the present invention, the foregoing objects are attained by providing a display device having an amplifying circuit to which grayscale voltages are input for driving data lines connected to display elements, wherein the differential amplifier according to the present invention described above serves as the amplifying circuit.

The meritorious effects of the present invention are summarized as follows.

In accordance with the present invention, it is possible to produce highly accurate voltage outputs regardless of variances in element characteristics due to manufacture.

Further, in accordance with the present invention, the number of grayscale voltages that are applied to a decoder and the number of transistors constructing the decoder are reduced by a differential amplifier that is capable of producing multi-level outputs, and it is possible to reduce the area of a digital-to-analog converter.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
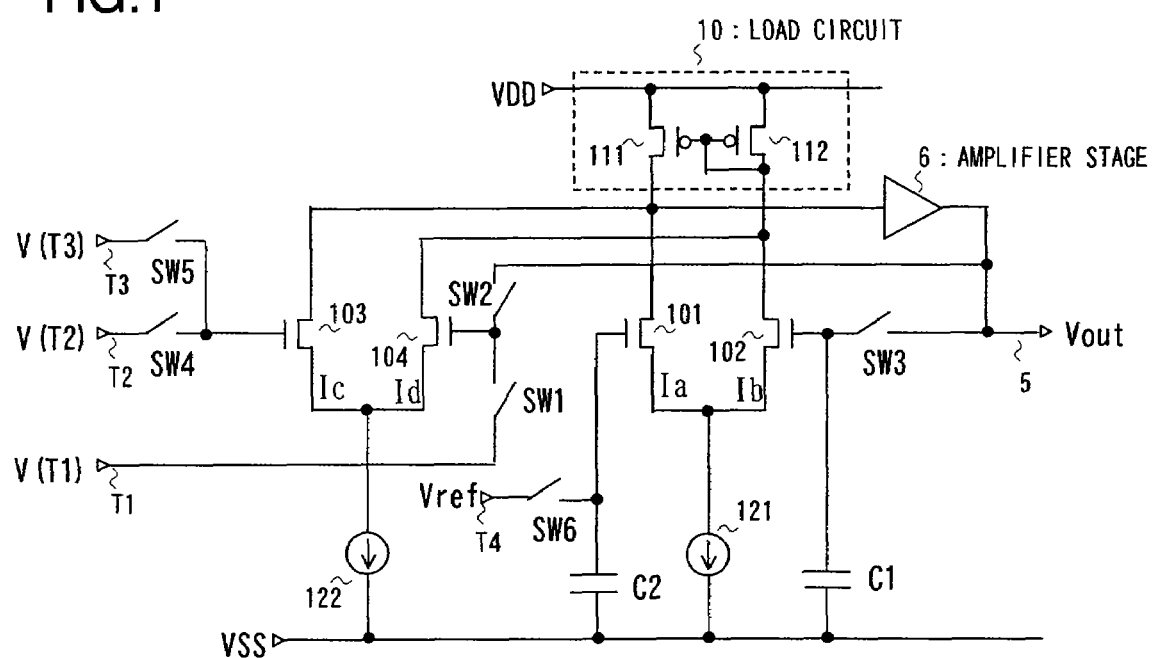
FIG. 1 is a diagram illustrating the structure of a first embodiment of the present invention.

Embodiments of the present invention will now be described in detail with reference to the accompanying drawings. It should be noted that identical structural elements in the Figures are designated by like reference characters.

FIG. 1 is a diagram illustrating the structure of a differential amplifier according to a first embodiment of the present invention. As shown in FIG. 1, the differential amplifier according to this embodiment includes a first differential pair (101, 102) driven by a first current source 121 and a second differential pair (103, 104) driven by a second current source 122. The differential pairs are commonly connected to a load circuit 10. The gate of a first transistor 101 of the first differential pair is connected to a terminal T4, to which a reference voltage is applied, via a switch SW6, and the gate of a second transistor 102 of the first differential pair is connected to an output terminal 5 via a switch SW3.

The gate of a first transistor 103 of the second differential pair is connected via switches SW4 and SW5 to terminals T2 and T3, respectively, to which voltages V(T2) and V(T3), respectively, are applied, and the gate of the second transistor 104 of the second differential pair is connected via switches SW1 and SW2 to a terminal T1 to which a voltage V(T1) is applied, and to the output terminal 5, respectively.

Capacitors C2 and C1 are connected between the gates of the first and second transistors 101 and 102, respectively, of the first differential pair and a power supply VSS on the low potential side.

An amplifier stage 6 is connected between output ends of the first and second differential pairs (a common drain end of the transistors 101 and 103) and the output terminal 5.

As a specific example of circuitry, the load circuit 10 comprises a current mirror circuit (111, 112). The input end of the current mirror circuit (a node at which the drain and gate of transistor 112 are connected) is connected to commonly connected drains of the second transistors 102 and 104 of the first and second differential pairs, respectively, and the output end of the current mirror (the drain of transistor 111) is connected to the commonly connected drains of the first transistors 101 and 103 of the first and second differential pairs.

The differential amplifier of the embodiment shown in FIG. 1 is such that voltages conforming to the voltages V(T1), V(T2) and V(T3) can be output highly accurately irrespective of a variance in transistor characteristics. Operation of the amplifier will be described with reference to FIG. 2.

Figure 2:
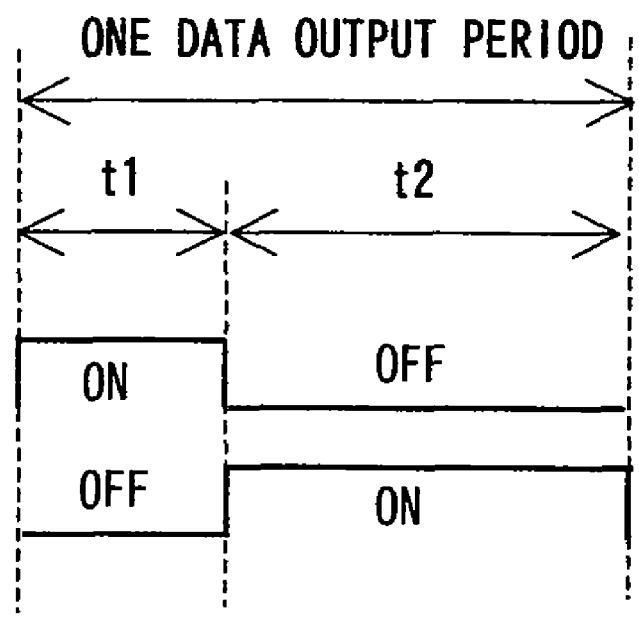
FIG. 2 is a diagram illustrating an example of switch control according to the first embodiment.

FIG. 2 is a timing chart illustrating ON/OFF control of each of the switches in the differential amplifier of FIG. 1 in one data output period. The one data output period is divided into two time periods t1 and t2. The operation of the differential amplifier of FIG. 1 will be described with reference to FIG. 2.

Switches SW1, SW3, SW4 and SW6 are turned ON and switches SW2 and SW5 art turned OFF in time period t1. As a result, the first differential pair (101, 102) takes on the form of a feedback connection. That is, in the first differential pair (101, 102), the reference voltage Vref is supplied to the non-inverting input end thereof (the gate of the transistor 101) and an output voltage Vout is fed back to the inverting input end thereof (the gate of the transistor 102). The reference voltage Vref and output voltage Vout are stored in the capacitors C2 and C1, respectively, connected to the first differential pair (101, 102). The output voltage Vout at this time becomes a voltage that conforms to the voltage Vref that is applied to the gate of transistor 101. It should be noted that since the first differential pair (101, 102) and second differential pair (103, 104) have their output pairs commonly connected, the output voltage Vout is influenced by the voltages V(T2), V(T1) that are applied to the differential input pair of the second differential pair and also by a variance in the characteristics of the transistors constructing the circuit if such variance exists.

More specifically, in time period t1, the output voltage Vout becomes a voltage that has been influenced by the reference voltage Vref, voltages V(T2) and V(T1) and variance in the transistor characteristics. This can be expressed by Equation (1) below.

$$Vout = Vref + \text{delta-}V \tag{1}$$

where delta-V represents a deviation in voltage from the reference voltage Vref.

If we let Ia, Ib, Ic and Id represent currents that flow into the transistors 101, 102, 103 and 104, respectively, of the first differential pair (101, 102) and second differential pair (103, 104), then Equation (2) below will hold from the relationship between the input and output currents of the current mirror circuit (111, 112) in the stable state of time period t1.

$$Ia + Ic = Ib + Id + \text{delta-}I \tag{2}$$

where delta-I represents a current deviation caused by a variance in characteristics between the pair of transistors 111 and 112 of the current mirror circuit (111, 112).

Next, in time period t2, switches SW1, SW3, SW4 and SW6 are turned OFF and switches SW2 and SW5 are turned ON.

At this time the reference voltage Vref and the voltage (Vref+delta-V) that were stored in time period t1 are held in the capacitors C2 and C1, respectively, and the reference voltage Vref and voltage (Vref+delta-V) are applied to the differential input pair (the gates of transistors 101, 102) of the first differential pair (101, 102) in a manner similar to that in time period t1.

The second differential pair (103, 104), on the other hand, takes on the form of a feedback connection in which the voltage V(T3) and output voltage Vout are applied to the non-inverting input end (the gate of transistor 103) and inverting input end (the gate of transistor 104), respectively Accordingly, the output voltage Vout changes to a voltage conforming to the voltage V(T3) that is applied to the gate of transistor 103.

In the first differential pair (101, 102), however, the voltages that are applied to the differential input pair over the time periods t1, t2 are equal and hence no change in state occurs. In the time period t2, therefore, the stable state of the second differential pair (103, 104) also is maintained in substantially the same state as that in time period t1. That is, operation is such that the states of the currents that flow into the transistors of the first differential pair (101, 102) and into the transistors of the second differential pair (103, 104) are kept the same in time periods t1 and t2.

Further, in the relationship between the two input voltages input differentially to the differential input pair and the currents (differential currents) that flow into the differential pair, if the pair of transistors of a differential pair are both within a voltage range in which the drain current is held substantially fixed with respect to a change in drain-to-source voltage, then the currents that flow into the differential pair do not change when there is a potential fluctuation in which the two input voltages maintain a potential difference (a differential voltage).

The reason for this is that with a change in the two input voltages, the common source potential of the differential pair also changes and the respective currents are maintained in such a manner that the gate-to-source voltage between the pair of transistors of the differential pair is rendered constant.

Accordingly, the two input voltages to the second differential pair (103, 104) in the time periods t1 and t2 satisfy the relation of Equation (3) below, which is not dependent upon a variance in the characteristics of the transistors constituting the differential amplifier.

$$V(T2)-V(T1)=V(T3)-Vout \quad (3)$$

In Equation (3) above, the left and right sides represent input voltage differences of the differential input pair of the second differential pair (103, 104) in the time periods t1 and t2. This means that this relationship is maintained in the time periods t1 and t2. On the basis of Equation (3), the output voltage Vout is represented by Equation (4) below.

$$Vout=V(T3)+[V(T2)-V(T2)] \quad (4)$$

In Equation (4) above, [V(T1)−V(T2)] may be regarded as the amount of level shift.

In view of the foregoing, the differential amplifier of FIG. 1 is capable of current-amplifying and outputting the level-shifted voltage in accordance with the voltages V(T1) and V(T2) with respect to the voltage V(T3). Further, highly accurate voltage outputs can be produced irrespective of a variance in transistor characteristics.

It should be noted that the reference voltage Vref need only be constant in one data output period and may be a different voltage from one data output period to the next. For example, it is possible for any of the voltages V(T1), V(T2) and V(T3) to be used as the reference voltage Vref.

Further, in the differential amplifier shown in FIG. 1, the capacitors C2 and C1 are connected as a pair between the differential input pair of the first differential pair (101, 102) and the power supply VSS. It is possible to suppress the effects of power supply noise and switching noise, etc., stabilize the output voltage Vout and produce highly accurate outputs.

For example, even if power supply noise occurs in the power supply VSS, the differential input pair of the first differential pair (101, 102) develops a fluctuation in potential via the capacitors C2 and C1, respectively, but the potential difference between the differential input pair does not change. As a result, the influence upon the output voltage Vout can be suppressed.

Further, in a case where the switches SW3 and SW6 are constituted by transistor switches, switch noise is produced. Switch noise is caused by a charge inflow that accompanies channel extinction when the transistor switch changes from the ON to the OFF state, and by capacitive coupling produced between the capacitor C2 or C1 and the parasitic capacitance of the transistor switch.

However, by making the transistor switches SW3 and SW6 identical in size and adopting the same capacitance values for the capacitors C2 and C1, the potential variations ascribable to switch noise of the pair of differential inputs of the first differential pair (101, 102) are made equal and influence upon the output voltage Vout can be suppressed.

It should be noted that although the reference voltage Vref and voltage (Vref+delta-V) stored in the capacitors C2 and C1, respectively, are not necessarily equal, the influence upon output voltage Vout can be suppressed fully if the potential difference between these stored voltages is comparatively small. Further, highly accurate outputs can be maintained even if the capacitance values of the capacitors C2 and C1 is made small.

Figure 21:
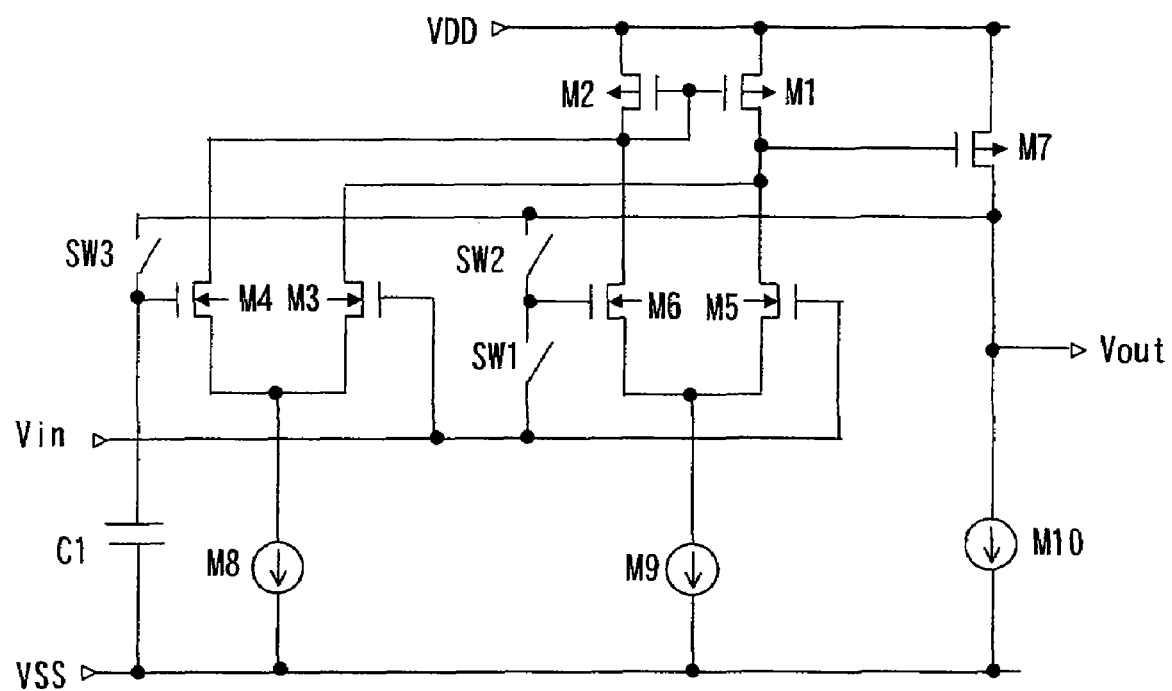
FIG. 21 is a diagram illustrating the structure of a differential amplifier according to the prior art.
Figure 22:
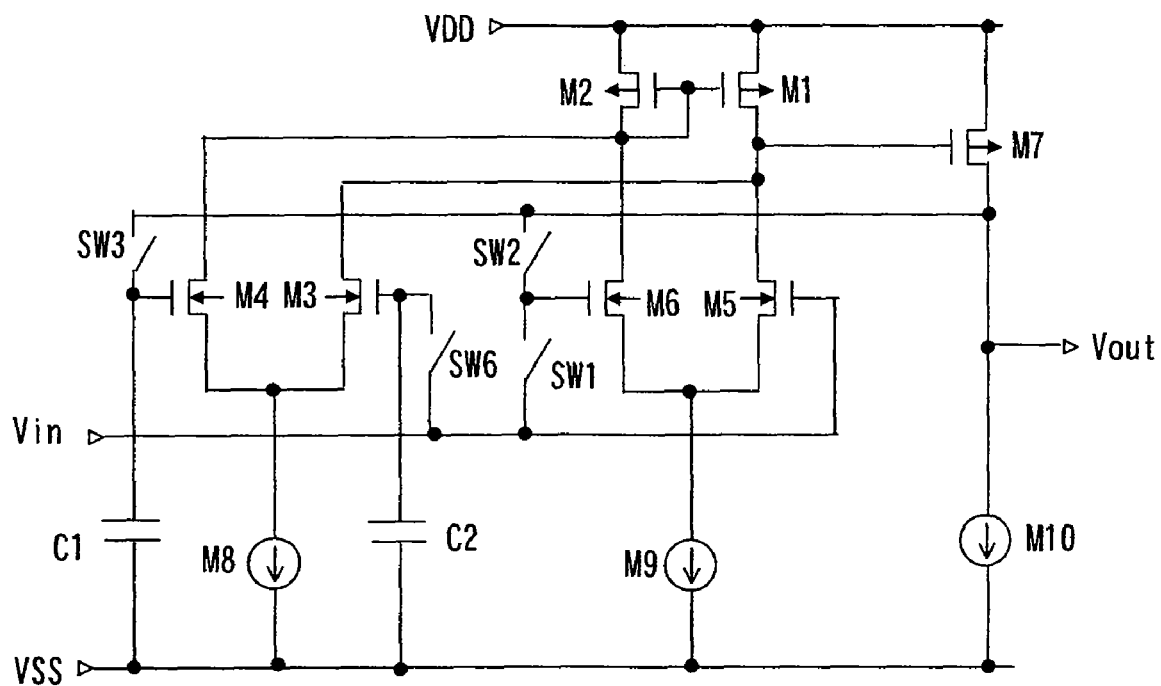
FIG. 22 is a diagram illustrating another structure of a differential amplifier according to the prior art.
Figure 23:
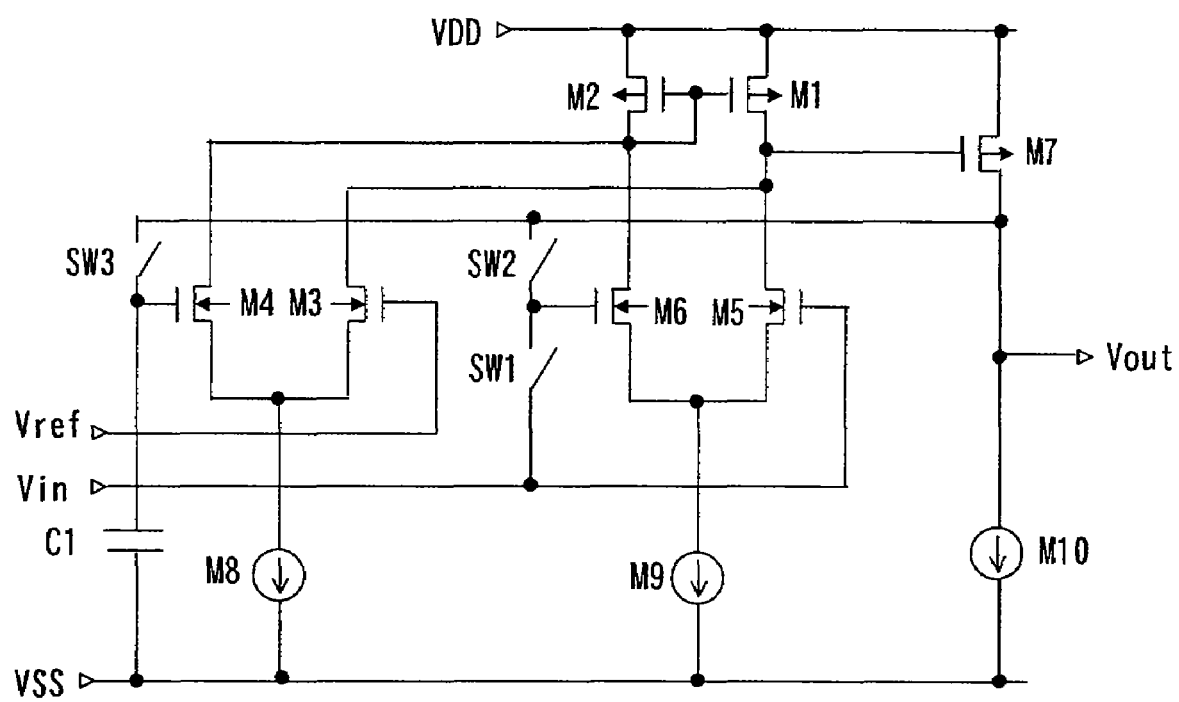
FIG. 23 is a diagram illustrating a further structure of a differential amplifier according to the prior art.
Figure 24:
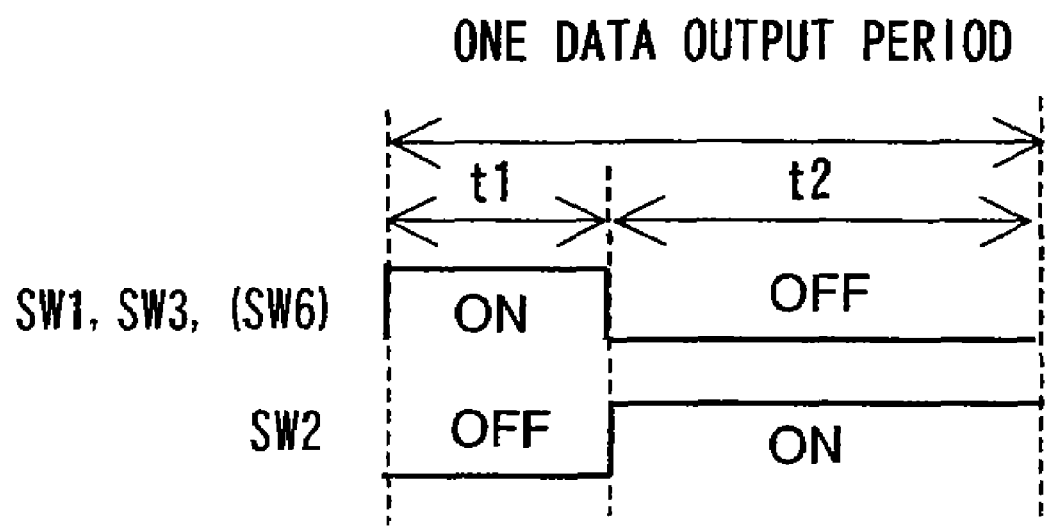
FIG. 24 is a diagram illustrating an example of switch control in FIGS. 21, 22 and 23.

By contrast, in case of an arrangement in which a capacitor has been connected only to one member of a differential input pair, as in the conventional differential amplifier illustrated in FIG. 21 or FIG. 23, the output voltage Vout is readily susceptible to the influence of power supply noise or switch noise and there is a limitation upon the increase in accuracy of the output voltage Vout.

Further, with regard to switch noise, the effects of switch noise can be suppressed further by providing noise canceling circuits at respective ones of the nodes of the differential input pair of the differential pair (101, 102) and the switches SW6 and SW3. This embodiment is such that in a case where the switch SW6, for example, is provided with a noise canceling circuit (not shown) which includes a transistor which has the same polarity as that of the transistor switch SW6, and which has drain and source connected to the node at which the switch SW6 and gate of the transistor 101 are connected, and has a gate supplied with a signal that is the inverse of the control signal of the transistor switch SW6. A similarly constructed noise canceling circuit may be provided at the node at which the switch SW3 and gate of the transistor 102 are connected.

Thus, as described above, the differential amplifier of FIG. 1 eliminates the effects of a variance in transistor characteristics, power supply noise and switch noise, etc., and makes it possible to output highly accurate voltages.

A differential amplifier constructed to have polarities opposite those shown in FIG. 1 will also provide similar actions and effects as a matter of course. That is, in FIG. 1, the first differential pair (101, 102) and second differential pair (103, 104) are constituted by NMOS transistors and the current mirror (111, 112) is constituted by PMOS transistors. However, the first differential pair (101, 102) and second differential pair (103, 104) may be constituted by PMOS transistors and the current mirror (111, 112) by NMOS transistors.

Further, in the example shown in FIG. 1, the capacitors C2 and C1 have first ends connected to the differential input pair of the first differential pair and second ends connected to the power supply VSS on the low potential side. However, it does not matter if the connections of the second ends of the capacitors C2 and C1 are to the power supply VDD on the high potential side or to any power supply instead of the power supply VSS on the low potential side. The same will hold true in the embodiments set forth below.

Furthermore, the timing chart of control of each of the switches in FIG. 2 has been illustrated as the most simple example in which control of two types is carried out, namely control of the switches SW1, SW3, SW4 and SW6 and control of switches SW2 and SW5, as shown in FIG. 2.

However, in a case where switch elements have parasitic capacitance and the effects of the capacitive coupling thereof cannot be ignored at the time of the switching operation, control in which the timing of the switching operation of each of the switches is staggered slightly may be performed as necessary.

Figure 3:
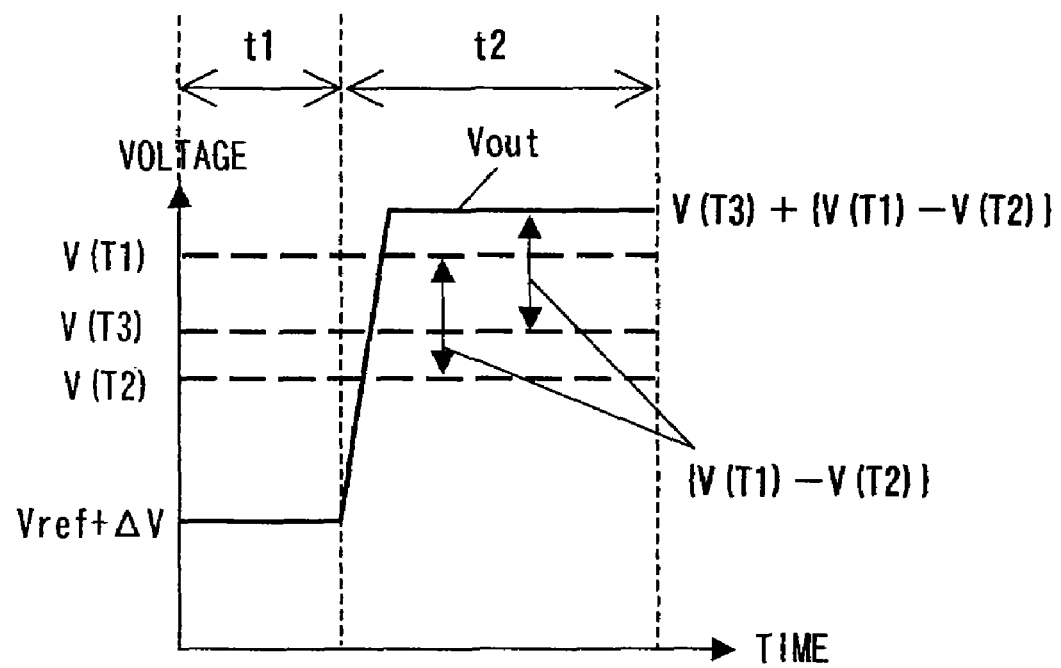
FIG. 3 is a waveform diagram useful in describing the operation of the first embodiment.

FIG. 3 is a voltage waveform diagram illustrating the manner in which the output of the differential amplifier of FIG. 1 changes. FIG. 3 illustrates a case where the voltages V(T1), V(T2) and V(T3), Vref have been set to values that differ from one another.

The output voltage Vout is as indicated by Equation (1) above in time period t1 and by Equation (4) above in time period t2.

The potential difference between the output voltage Vout and V(T3) in time period t2 is held at the potential difference between the voltages V(T1) and V(T2) and satisfies the relation of Equation (3).

By applying suitable voltages for V(T1), V(T2) and V(T3), a desired voltage can be output as the voltage Vout in time period t2. It should be noted that the reference voltage Vref may be made to coincide with any one of V(T1), V(T2) and V(T3) over one data output period.

Further, the differential amplifier of FIG. 1 is also capable of producing multi-level outputs in which the number of output voltages is greater than the number of input voltages.

Figures 4A, 4B:
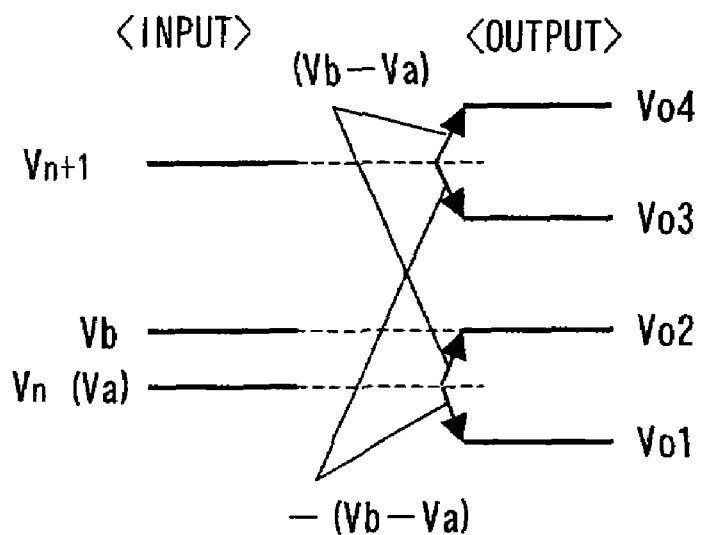
FIGS. 4A and 4B are diagrams useful in describing an example in which multi-level outputs are obtained by a differential amplifier according to the first embodiment.

FIGS. 4A and 4B are diagrams useful in describing an embodiment in which multi-level outputs are obtained by the differential amplifier of FIG. 1. FIG. 4A illustrates the relationship between input and output levels, and FIG. 4B illustrates the relationship among voltage selection states in which four output levels have been correlated with 2-bit digital data (D1,D0).

FIG. 4A illustrates a case where input voltages have three levels of voltages $V_n$, $V_{n+1}$, Va and Vb (where Va=$V_n$, $V_n$<$V_{n+1}$ hold).

By selectively supplying the voltages $V_n$ (Va), $V_{n+1}$, and Vb as the voltages V(T1), V(T2), and V(T3), respectively, four levels Vo1 to Vo4 can be output as the output voltages.

More specifically, in a case where the voltage Vo1 is output, we have $$Vo1 = V_n - (Vb - Va) \tag{5}$$

from Equation (4) above if [V(T1), V(T2), V(T3)]=(Va, Vb, $V_n$) is selected.

That is, the voltage Vo1 is a voltage obtained by level-shifting the voltage $V_n$ toward the low potential side by the potential difference (Vb−Va).

Further, in a case where the voltage Vo2 is output, we have $$Vo2 = V_n + (Vb - Va) \tag{6}$$

if [V(T1), V(T2), V(T3)]=(Vb, Va, $V_n$) is selected.

That is, the voltage Vo2 is a voltage obtained by level-shifting the voltage $V_n$ toward the high potential side by the potential difference (Vb−Va).

Further, in a case where the voltage Vo3 is output, we have $$Vo3 = V_{n+1} - (Vb - Va) \tag{7}$$

if [V(T1), V(T2), V(T3)]=(Va, Vb, $V_{n+1}$) is selected.

That is, the voltage Vo3 is a voltage obtained by level-shifting the voltage $V_{n+1}$ toward the low potential side by the potential difference (Vb−Va).

Further, in a case where the voltage Vo4 is output, we have $$Vo4 = V_{n+1} + (Vb - Va) \tag{8}$$

if [V(T1), V(T2), V(T3)]=(Vb, Va, $V_{n+1}$) is selected.

That is, the voltage Vo4 is a voltage obtained by level-shifting the voltage $V_{n+1}$ toward the high potential side by the potential difference (Vb−Va).

In view of the foregoing, output voltages of the four levels Vo1, Vo2, Vo3 and Vo4 are possible for the three input voltages Vn (Va), $V_{n+1}$ and Vb.

It should be noted that if the set-up is such that the potential difference between Vb and Va becomes one-fourth of the potential difference between $V_{n+1}$ and $V_n$ in FIG. 4A, then the four output levels can be made levels equally spaced apart by the potential difference (Vb−Va).

Further, as illustrated in FIG. 4B, it is also possible to select and output the four voltages Vo1 to Vo4 by the 2-bit digital data (D1,D0).

It should be noted that the output levels in FIGS. 4A and 4B are voltage levels obtained by adding or subtracting the potential difference (Vb−Va) to and from the voltages $V_{n+1}$ and $V_n$. If four output levels are generated by selecting the two closest neighboring levels as the voltages $V_{n+1}$, $V_n$ from m-number of input voltages, then 2m-number of output levels can be output. Although FIG. 4A illustrates an example in which Va=$V_n$ holds, the voltages Va and Vb can be set at will.

Figures 5A, 5B:
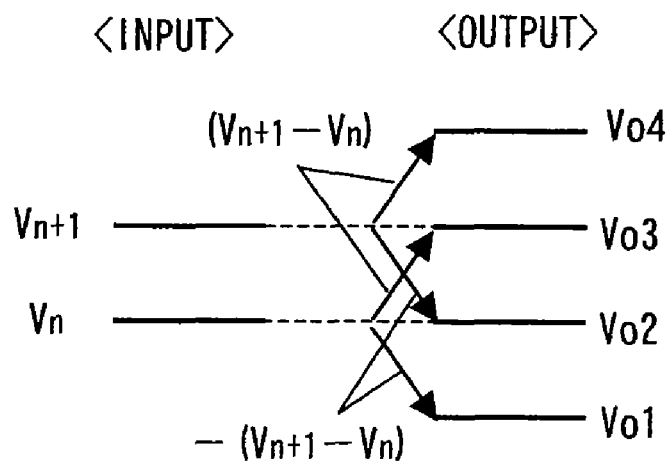
FIGS. 5A and 5B are diagrams useful in describing another example in which multi-level outputs are obtained by a differential amplifier according to the first embodiment.

FIGS. 5A and 5B are diagrams useful in describing an embodiment, which is different from that of FIG. 4, illustrating multi-level outputs obtained by the differential amplifier of FIG. 1.

FIG. 5A illustrates the relationship between input and output levels, and FIG. 5B illustrates the relationship among voltage selection states in which four output levels have been correlated with 2-bit digital data (D1,D0). FIG. 5A illustrates a case where input voltages have two levels of voltages $V_n$ and $V_{n+1}$ (where $V_n$<$V_{n+1}$ holds). By selectively inputting the voltages $V_n$ and $V_{n+1}$ as the voltages V(T1), V(T2) and V(T3), respectively, four levels Vo1 to Vo4 can be output as the output voltages.

More specifically, in a case where the voltage Vo1 is output, we have $$Vo1 = V_n - (V_{n+1} - V_n) \tag{9}$$

from Equation (4) above if [V(T1), V(T2), V(T3)]=($V_n$, $V_{n+1}$, $V_n$) is selected.

That is, the voltage Vo1 is a voltage obtained by level-shifting the voltage $V_n$ toward the low potential side by the potential difference ($V_{n+1}$−$V_n$).

Further, in a case where the voltage Vo2 is output, we have $$Vo2 = V_{n+1} - (V_{n+1} - V_n) \tag{10}$$
$$= V_n$$

if [V(T1), V(T2), V(T3)]=($V_n$, $V_{n+1}$, $V_{n+1}$) is selected.

That is, the voltage Vo2 is a voltage obtained by level-shifting the voltage $V_{n+1}$ toward the low potential side by the potential difference ($V_{n+1}$−$V_n$). This is a potential identical with that of voltage $V_n$.

Further, in a case where the voltage Vo3 is output, we have $$Vo3 = V_n + (V_{n+1} - V_n) \tag{11}$$
$$= V_{n+1}$$

if [V(T1), V(T2), V(T3)]=($V_{n+1}$, $V_n$, $V_n$) is selected.

That is, the voltage Vo3 is a voltage obtained by level-shifting the voltage $V_n$ toward the high potential side by the potential difference ($V_{n+1}$−$V_n$). This is a potential identical with that of voltage $V_{n+1}$.

Further, in a case where the voltage Vo4 is output, we have $$Vo4 = V_{n+1} + (V_{n+1} - V_n) \tag{12}$$

if [V(T1), V(T2), V(T3)]=($V_{n+1}$, $V_n$, $V_{n+1}$) is selected.

That is, the voltage Vo4 is a voltage obtained by level-shifting the voltage $V_{n+1}$ toward the high potential side by the potential difference $(V_{n+1}-V_n)$.

In view of the foregoing, output voltages of four levels are possible for two input voltages. It should be noted that in FIGS. 5A and 5B, the four output levels are levels equally spaced apart by the potential difference $(V_{n+1}-V_n)$.

Further, as illustrated in FIG. 5B, it is also possible to select and output the four voltages Vo1 to Vo4 by the 2-bit digital data (D1,D0).

Furthermore, in FIGS. 5A and 5B, if four output levels are generated by selecting the two closest neighboring levels from m-number of input voltages, then 2m-number of output levels can be output. Further, if four output levels are generated by selecting any two levels, then a maximum of $m^2$-number of output levels can be output.

Figures 6A, 6B:
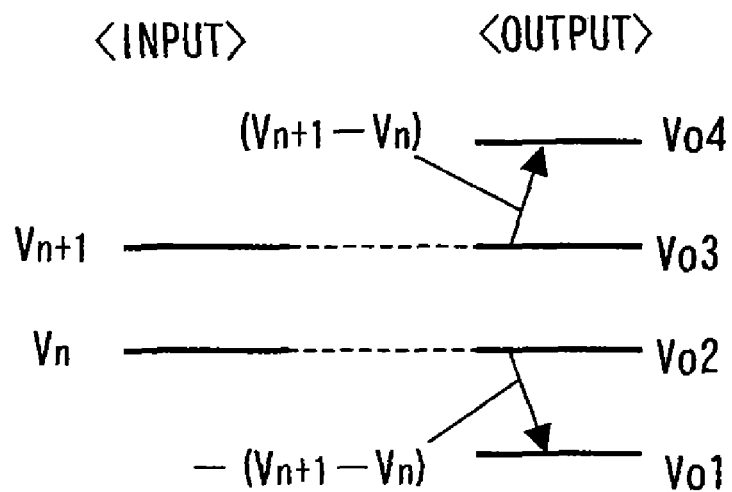
FIGS. 6A and 6B are diagrams useful in describing a further example in which multi-level outputs are obtained by a differential amplifier according to the first embodiment.

FIGS. 6A and 6B are diagrams useful in describing a further embodiment of multi-level outputs obtained by the differential amplifier of FIG. 1.

FIG. 6A illustrates the relationship between input and output levels, and FIG. 6B illustrates the relationship among voltage selection states in which four output levels have been correlated with 2-bit digital data (D1,D0).

FIG. 6A also illustrates a case where input voltages have the two levels of voltages $V_n$ and $V_{n+1}$, in a manner similar to that of FIG. 5A. By selectively inputting the voltages $V_n$ and $V_{n+1}$ as the voltages V(T1), V(T2) and V(T3), respectively, four levels Vo1 to Vo4 can be output as the output voltages, as illustrated in FIG. 6B.

The selection conditions of V(T1), V(T2) and V(T3) with regard to Vo1 and Vo4 are similar to those in FIG. 5B and the same output levels are obtained.

Since the selection conditions of V(T1), V(T2) and V(T3) with regard to Vo2 and Vo3 are different from those of FIG. 5B, a case where Vo2 and Vo3 are output will be described with reference to FIGS. 6A and 6B.

More specifically, in a case where the voltage Vo2 is output, we have $$Vo2 = V_n - (V_n - V_n) \qquad (13)$$
$$= V_n$$

if $[V(T1), V(T2), V(T3)] = (V_n, V_n, V_n)$ is selected.

That is, the voltage Vo2 is a voltage obtained by level-shifting the voltage $V_n$ by a potential difference of zero. This is a potential identical with that of voltage $V_n$.

In a case where the voltage Vo3 is output, we have $$Vo3 = V_{n+1} + (V_{n+1} - V_{n+1}) \qquad (14)$$
$$= V_{n+1}$$

if $[V(T1), V(T2), V(T3)] = (V_{n+1}, V_{n+1}, V_{n+1})$ is selected. That is, the voltage Vo3 is a voltage obtained by level-shifting the voltage $V_{n+1}$ by a potential difference of zero. This is a potential identical with that of voltage $V_{n+1}$.

In view of the foregoing, output voltages of four levels are possible for two input voltages. It should be noted that the four output levels are levels equally spaced apart by the potential difference $(V_{n+1}-V_n)$.

Further, as illustrated in FIG. 6B, it is also possible to select and output the four voltages Vo1 to Vo4 by the 2-bit digital data (D1,D0).

Furthermore, in FIGS. 6A and 6B, if four output levels are generated by selecting the two closest neighboring levels from m-number of input voltages, then 2m-number of output levels can be output. Further, if four output levels are generated by selecting any two levels, then a maximum of $m^2$-number of output levels can be output.

Figure 7:
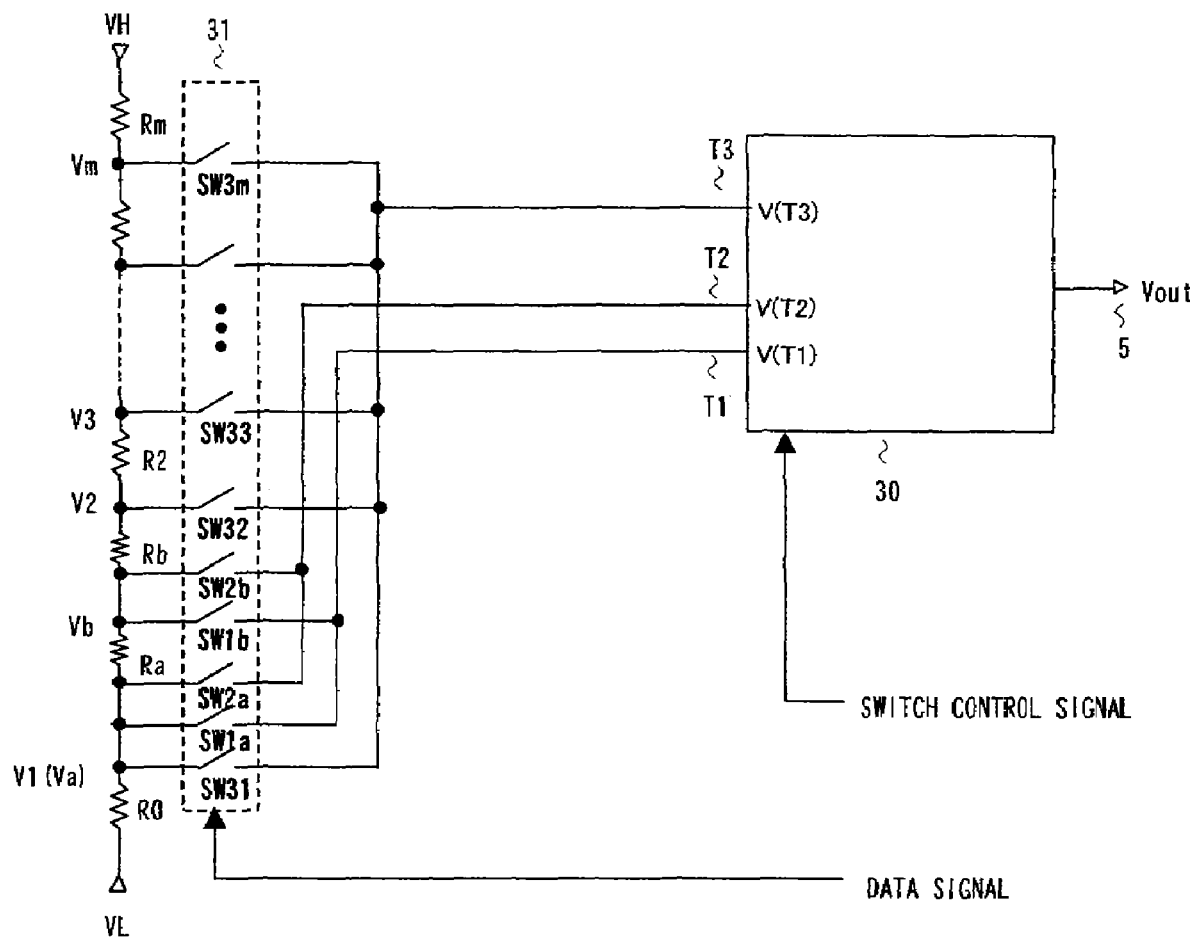
FIG. 7 is a diagram illustrating an example of a digital-to-analog converter having a differential amplifier according to the first embodiment.

FIG. 7 is a diagram illustrating the structure of an embodiment of a digital-to-analog converter that implements the input/output level relationships of FIGS. 4A and 4B using the differential amplifier of FIG. 1. In FIG. 7, a differential amplifier having the configuration described with reference to FIG. 1 is used as a circuit 30 (multi-level output differential amplifier).

In FIG. 7, m-number of voltages V1 to Vm selectively supplied to the circuit 30 are generated at connection terminals between a plurality of resistance elements R0 to Rm serially connected between power-supply voltages VH and VL, the voltages are selected by switches SW31 to SW3m of a switch group 31 and the selected voltage is output to a terminal T3.

Further, a resistance element R1 comprises resistance elements Ra and Rb. A voltage Va (where Va=V1 holds) produced from a connection terminal between resistance elements R0 and Ra and voltage Vb produced from a connection terminal between resistance elements Ra and Rb are selected by switches SW1a and SW2a and switches SW1b and SW2b of switch group 31 and are output to terminals T1 and T2.

A switch control signal is supplied to the circuit 30 and controls the ON and OFF operation of switches SW1 to SW6 in FIG. 1.

A selection signal is supplied to the switch group 31 and voltage levels that conform to the selection signal are output to terminals T1, T2 and T3. A digital data signal such as video data can be used as the selection signal.

The circuit 30 (the differential amplifier of FIG. 1) in the digital-to-analog converter circuit of FIG. 7 is capable of selectively inputting (m+1)-number of voltages V1 to Vm and Vb and therefore a maximum of 2m-number of voltage levels can be output, as described in conjunction with FIGS. 4A and 4B.

Thus, (m+1)-number of voltages can be selected appropriately as inputs to V(T1), V(T2) and V(T3) and it is possible to output level voltages the number of which is greater than the number of input voltages. It should be noted that although the generation of the voltages Va and Vb is performed by the resistance element R1 in FIG. 7, it may just as well be generated by any other resistance element besides resistance element R1.

As set forth above, the digital-to-analog converter of FIG. 7 using the differential amplifier of FIG. 1 is capable of obtaining a large number of output voltages with a small number of input voltages. As a result, the switches that select the input voltages can be reduced and the scale of the circuitry of the converter can be reduced in comparison with the conventional circuitry having the same number of output levels.

Figure 8:
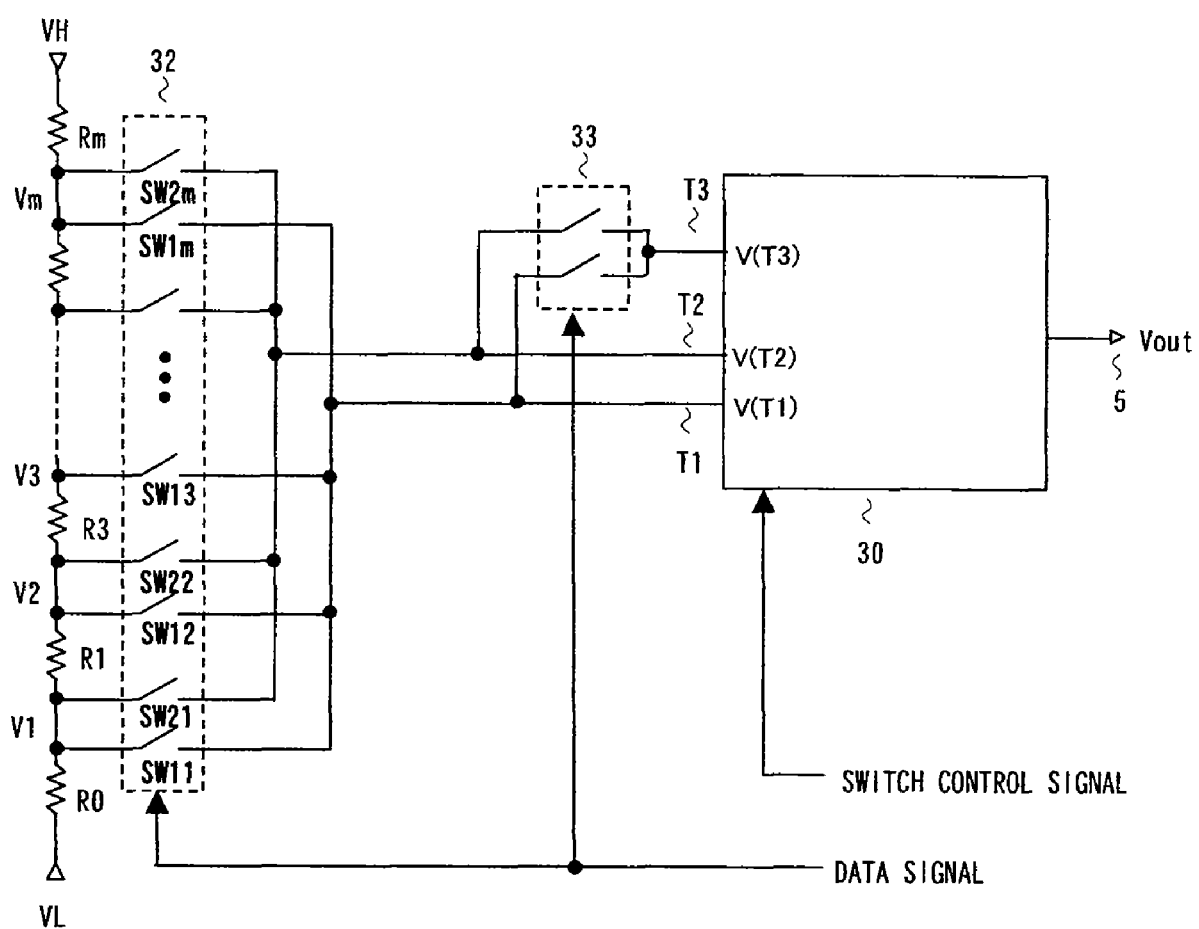
FIG. 8 is a diagram illustrating another example of a digital-to-analog converter having a differential amplifier according to the first embodiment.

FIG. 8 is a diagram illustrating the structure of an embodiment of a digital-to-analog converter that implements the input/output level relationships of FIGS. 5A and 5B and FIGS. 6A and 6B using the differential amplifier of FIG. 1. In FIG. 8, a differential amplifier having the configuration described with reference to FIG. 1 is used as the circuit 30 (multi-level output differential amplifier).

In FIG. 8, m-number of voltages V1 to Vm selectively supplied to the circuit 30 are generated at connection terminals between a plurality of resistance elements R0 to Rm serially connected between power-supply voltages VH and VL, the voltages are selected by switches SW11 to SW1$m$, SW21 to SW2$m$ of a switch group 32 and the selected voltages are output to two terminals T1 and T2.

Further, either of the voltages that have been output to the terminals T1 and T2 is selected by a switch group 33 and output to a terminal T3.

A switch control signal is supplied to the circuit 30 and controls the ON, OFF operation of switches SW1 to SW6 in FIG. 1.

Further, a selection signal is supplied to the switch groups 32 and 33 and voltage levels that conform to the selection signal are output to terminals T1, T2 and T3. A digital data signal such as video data can be used as the selection signal.

The circuit 30 (the differential amplifier of FIG. 1) in the digital-to-analog converter circuit of FIG. 8 is capable of selectively inputting m-number of voltages V1 to Vm. Therefore, as described with reference to FIGS. 5A and 5B and FIGS. 6A and 6B, if the two closest neighboring levels are selected and input, then 2m-number of voltage levels can be output. If any two levels are selected and input, then a maximum of $m^2$-number of voltage levels can be output.

Thus, m-number of voltages V1 to Vm can be selected appropriately as inputs to V(T1), V(T2) and V(T3) and it is possible to output level voltages the number of which is greater than the number of input voltages.

As set forth above, the digital-to-analog converter of FIG. 8 using the differential amplifier of FIG. 1 is capable of obtaining a large number of output voltages with a small number of input voltages. As a result, the switches that select the input voltages can be reduced and the scale of the circuitry of the converter can be reduced in comparison with the conventional circuitry having the same number of output levels.

Figure 9:
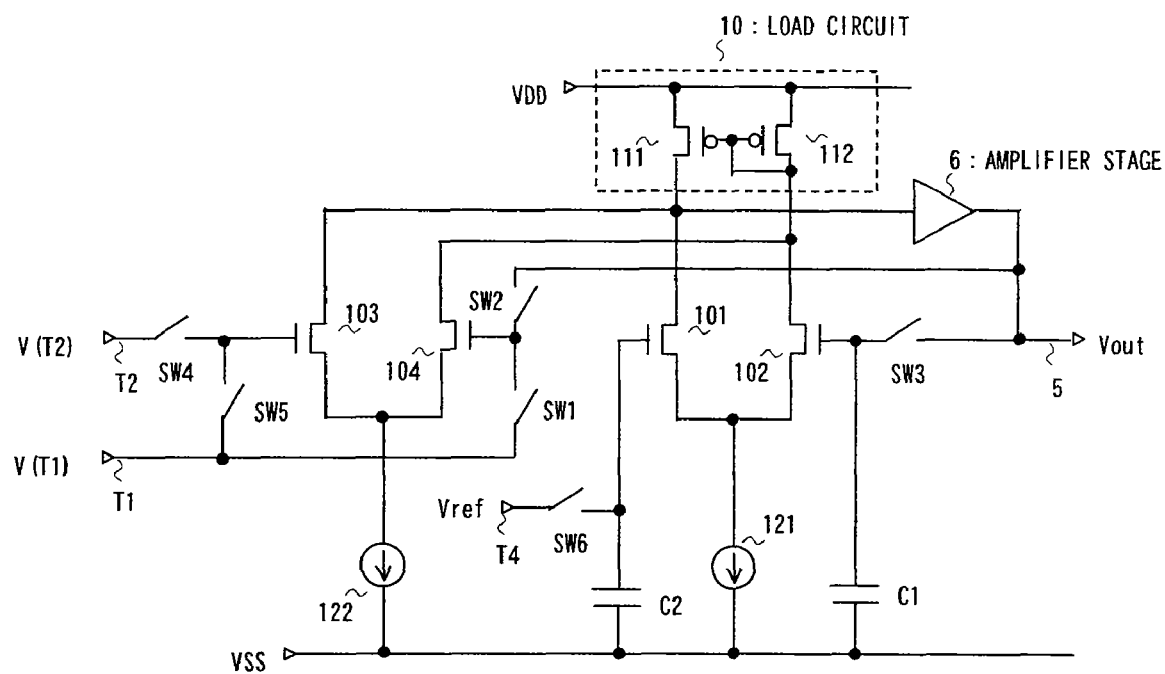
FIG. 9 is a diagram illustrating the structure of a second embodiment of the present invention.

FIG. 9 is a diagram illustrating a modification of the differential amplifier of FIG. 1. FIG. 1 illustrates an arrangement in a case where V(T3)=V(T1) holds at all times.

The differential amplifier shown in FIG. 9 differs from that of FIG. 1 in that the terminal T3 in FIG. 1 is eliminated and the switch SW5 is connected between the terminals T1 and T2. This arrangement is similar to that of FIG. 1 in all other respects.

Further, ON/OFF control of the switches SW1 to SW6 is as illustrated in FIG. 2.

The differential amplifier of FIG. 9 is such that the output voltage Vout is represented by Equation (15) below by substituting V(T3)=V(T1) into Equation (4) above.

$$V\text{out}=2\cdot V(T1)-V(T2) \quad (15)$$

In view of Equation (15) above, the output voltage Vout is a voltage obtained by externally dividing the voltages V(T1) and V(T2) at a 1:2 ratio.

That is, irrespective of a variance in transistor characteristics, the differential amplifier of FIG. 9 is capable of outputting a voltage, which is obtained by externally dividing the voltages V(T1) and V(T2) at a 1:2 ratio, as the output voltage Vout in highly accurate fashion.

It should be noted that an embodiment in which multi-level outputs are obtained by the differential amplifier of FIG. 9 is similar to that shown in FIGS. 6A and 6B.

Figure 10:
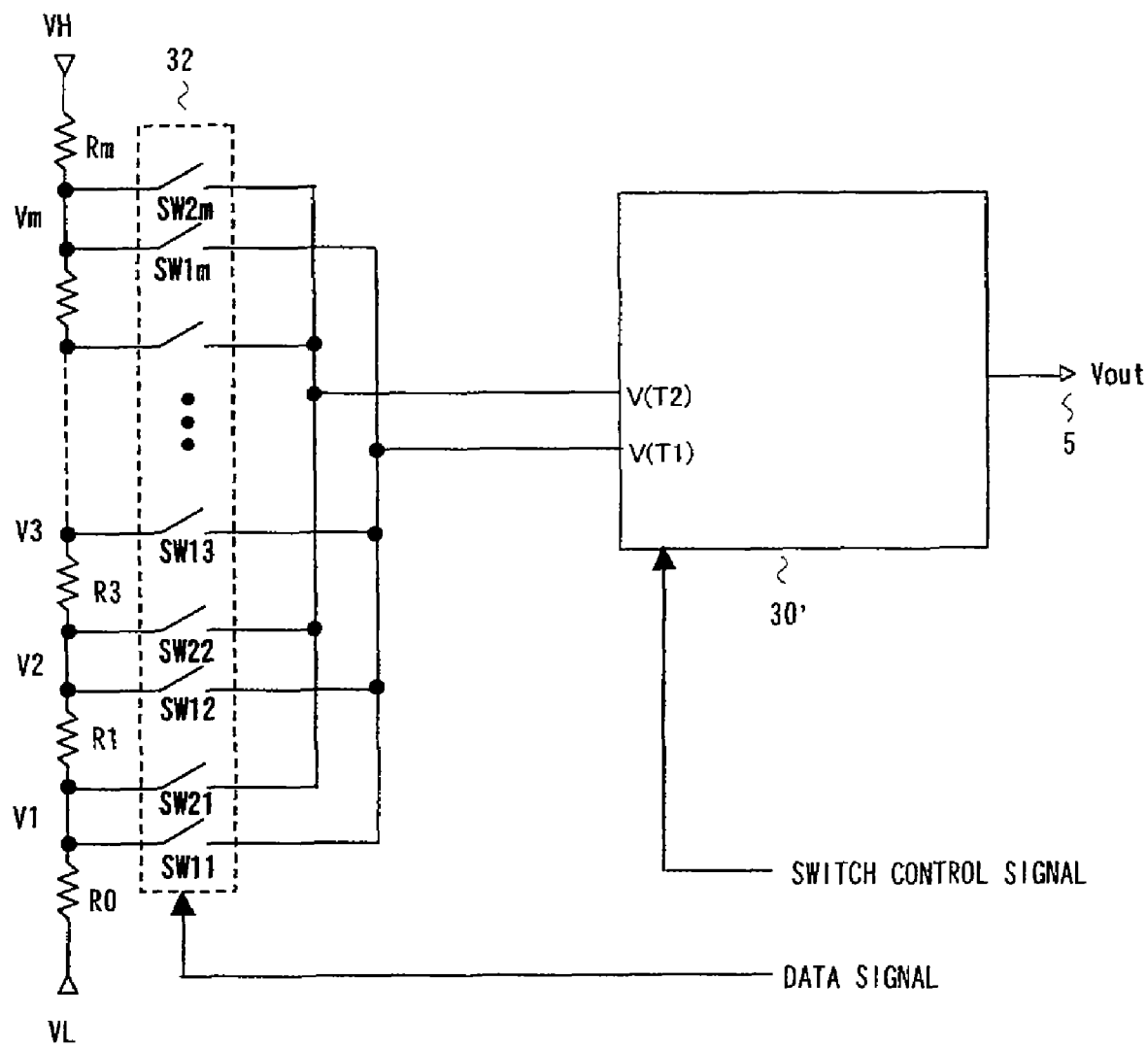
FIG. 10 is a diagram illustrating an example of a digital-to-analog converter having a differential amplifier according to the second embodiment.

FIG. 10 is a diagram illustrating the structure of an embodiment of a digital-to-analog converter that implements the input/output level relationships of FIGS. 6A and 6B using the differential amplifier of FIG. 9. In FIG. 10, the differential amplifier of FIG. 9 is used as a circuit 30'. In this case, the arrangement shown in FIG. 10 is obtained by eliminating the terminal T3 and switch group 33 from the arrangement of FIG. 8.

In the digital-to-analog converter of FIG. 10 as well, m-number of voltages V1 to Vm can be selectively supplied to the circuit 30'. In a case where the two closest neighboring levels are selected and input, therefore, 2m-number of voltage levels can be output. If any two levels are selected and input, then a maximum of $m^2$-number of voltage levels can be output.

Thus, m-number of voltages V1 to Vm can be selected appropriately as inputs to V(T1) and V(T2) and it is possible to output level voltages the number of which is greater than the number of input voltages.

As set forth above, the digital-to-analog converter of FIG. 10 using the differential amplifier of FIG. 9 is capable of obtaining a large number of output voltages with a small number of input voltages. As a result, the switches that select the input voltages can be reduced and the scale of the circuitry of the converter can be reduced in comparison with the conventional circuitry having the same number of output levels.

Figure 11:
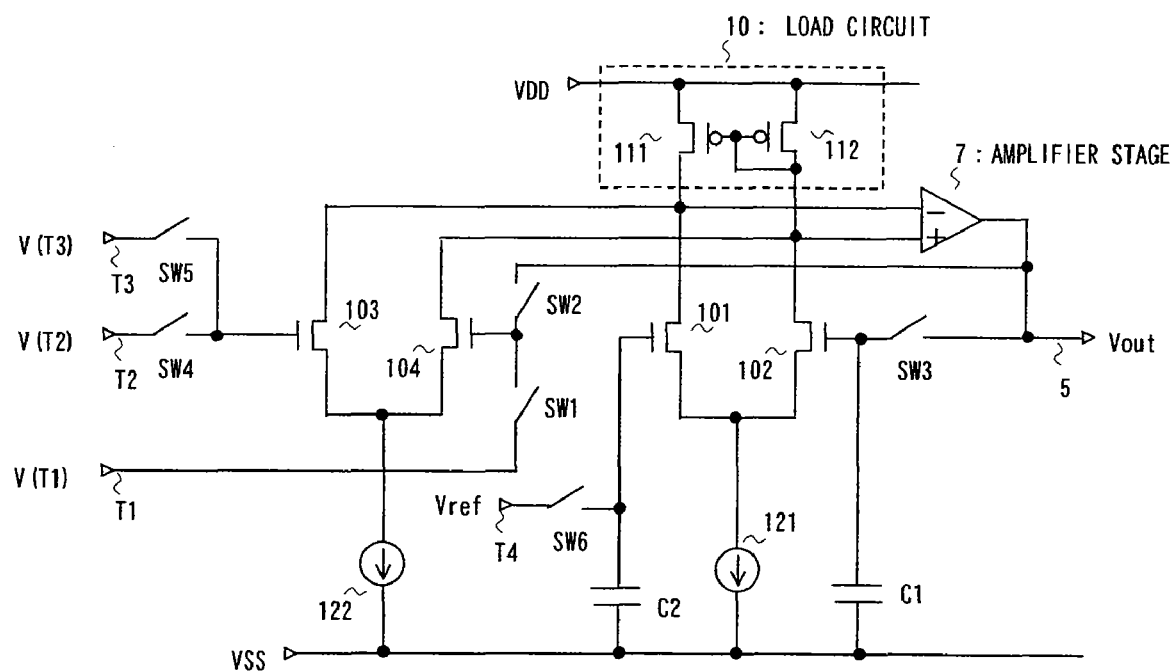
FIG. 11 is a diagram illustrating the structure of a third embodiment of the present invention.

FIG. 11 is a diagram illustrating a modification of the differential amplifier of FIG. 1. The embodiment illustrated in FIG. 11 differs in that the amplifier stage 6 of FIG. 1 is replaced by an amplifier stage 7. As shown in FIG. 11, the amplifier stage 7 has an input pair connected to first and second common connection nodes of output pairs of the first differential pair (101, 102) and second differential pair (103, 104), and an output end connected to the output terminal 5. The operation of the amplifier stage 7 is similar to that of the amplifier stage 6.

Figure 12:
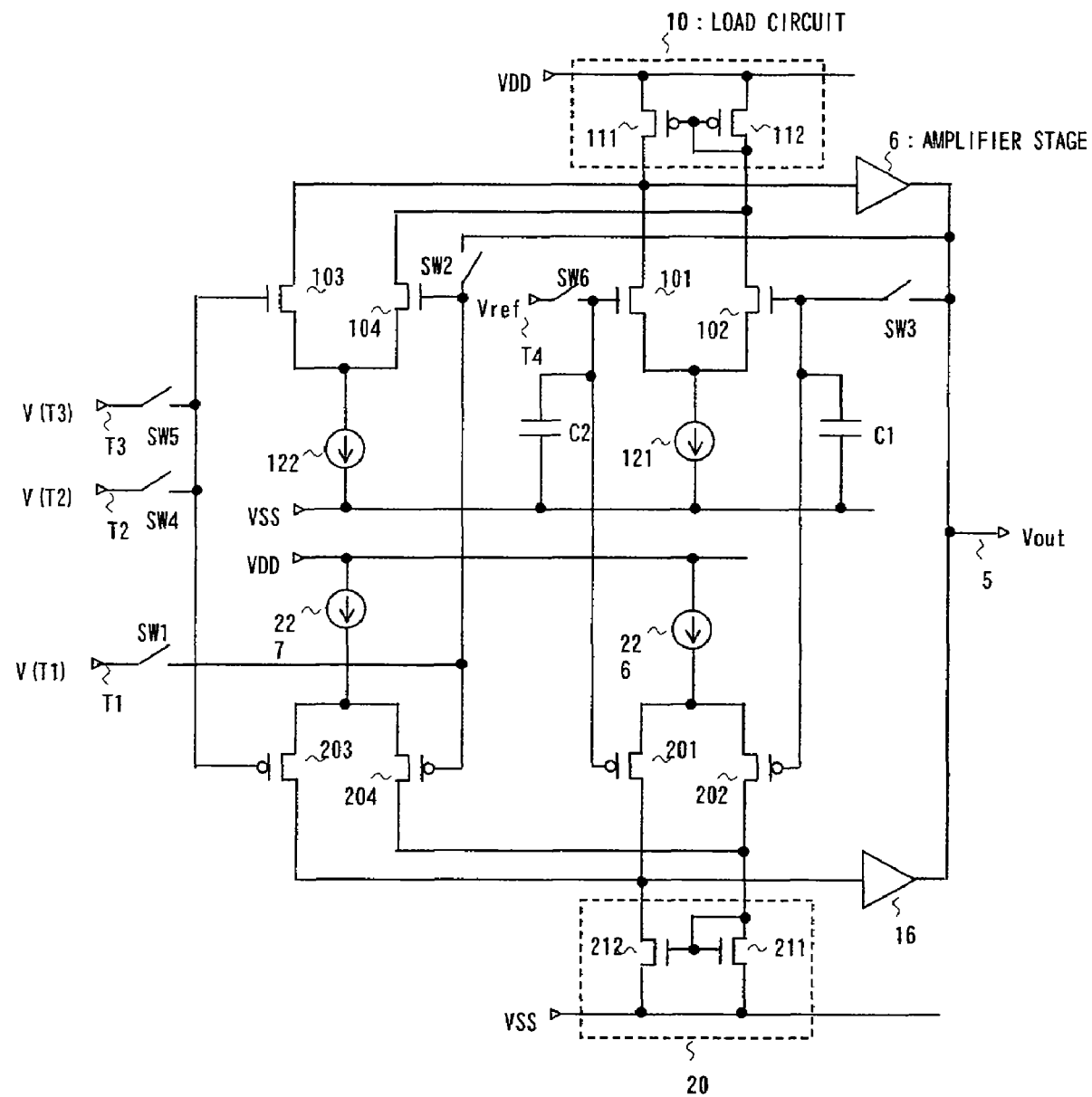
FIG. 12 is a diagram illustrating the structure of a fourth embodiment of the present invention.

FIG. 12 illustrates an arrangement in which the differential amplifier shown in FIG. 1 and a differential amplifier constructed to have polarities opposite those of FIG. 1 are combined. As shown in FIG. 12, the differential amplifier includes NMOS first and second differential pairs (101, 102) and (103, 104); one PMOS load circuit (111, 112) commonly connected to the first and second differential pairs; first and second current sources (121, 122) for supplying current to the first and second differential pairs, respectively; PMOS third and fourth differential pairs (201, 202) and (203, 204); one NMOS load circuit (211, 212) commonly connected to the third and fourth differential pairs; third and fourth current sources (226, 227) for supplying current to the third and fourth differential pairs, respectively; a first amplifier stage 6 for receiving a common output signal of the first and second differential pairs; and a second amplifier stage 16 for receiving a common output signal of the third and fourth differential pairs. The differential inputs of the first differential pair (101, 102) are connected to respective ones of the differential inputs of the third differential pair (201, 202), and the differential inputs of the second differential pair (103, 104) are connected to respective ones of the differential inputs of the fourth differential pair (203, 204).

In the first time period of the data output period, voltages V(T1), V(T2) at first and second input terminals T1 and T2, respectively, are applied to respective ones of differential inputs of the second and fourth differential pairs via first and fourth switches SW1 and SW4, which are in an ON state, and the voltage at output terminal 5 and the reference voltage are applied to respective ones of differential inputs of the first and third differential pairs via third and sixth switches SW3, SW6, which are in an ON state. Capacitors C1 and C2 have first ends connected to respective ones of differential inputs of the first and third differential pairs, and second ends connected to the power supply VSS on the low potential side. The voltage at the output terminal and the reference voltage Vref are stored in the capacitors C1 and C2, respectively.

In the second time period, the first, third, fourth and sixth switches are all in an OFF state, first differential inputs of the second and fourth differential pairs are connected to the output terminal 5 via the second switch SW2, which is in an ON state, and second differential inputs of the second and fourth differential pairs are connected to the third terminal T3 via the fifth switch SW5, which is in an ON state.

As shown in FIG. 12, the input pairs of the NMOS first differential pair (101, 102) and of the NMOS second differential pair (103, 104) are commonly connected to the input pairs of the PMOS third differential pair (201, 202) and of the PMOS fourth differential pair (203, 204), respectively. As a result, the switches SW1 to SW6 and the capacitors C1 and C2 need not be provided in each of the two differential amplifiers and can be shared by both differential amplifiers.

Although the amplifier stages 6 and 16 are shown as being separately provided in FIG. 12, it goes without saying that the amplifier stages 6 and 16 may be coupled as by a connection stage such as a floating current source to produce an interaction.

Figure 13:
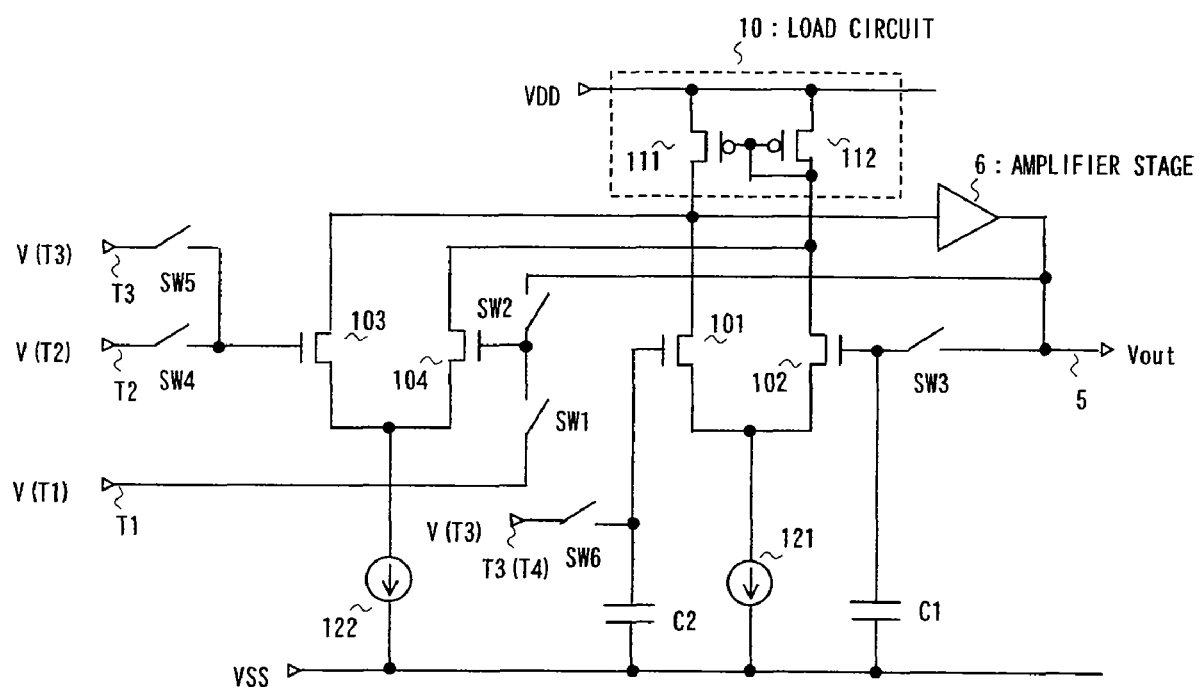
FIG. 13 is a diagram illustrating the structure of a fifth embodiment of the present invention.

FIG. 13 is a diagram illustrating an example of application of the differential amplifier shown in FIG. 1. The embodiment shown in FIG. 13 is an arrangement in which the reference voltage Vref that is applied to the terminal T4 in FIG. 1 is made to coincide with the voltage V(T3) that is supplied to the terminal T3.

Figure 14:
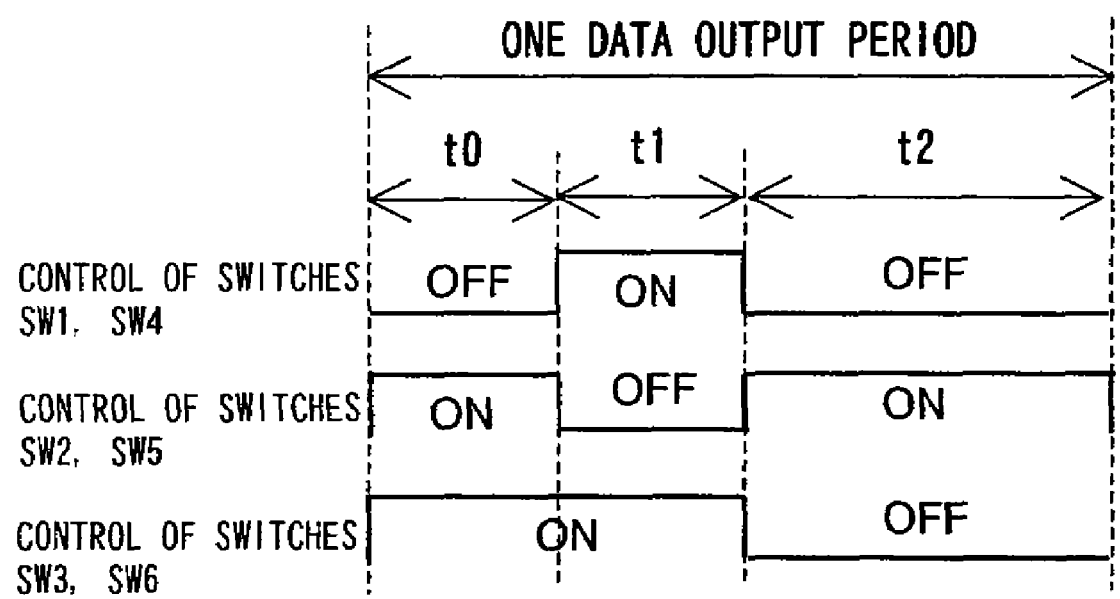
FIG. 14 is a diagram illustrating an example of switch control according to the fifth embodiment.

FIG. 14 is an embodiment of a timing chart indicating ON/OFF control of the switches in the differential amplifier of FIG. 13 in one data output period. This is a control method that raises the slew-rate of the differential amplifier of FIG. 13. This operation will be described with reference to FIGS. 13 and 14.

In FIG. 14, one data output period has been divided into three time periods t0, t1 and t2.

First, in time period t0, the switches SW1 and SW4 are turned OFF and the switches SW2, SW3, SW5 and SW6 are turned ON. As a result, the first differential pair (101, 102) and the second differential pair (103, 104) both take on the form of a feedback connection. That is, in the first and second differential pairs, the voltage V(T3) is applied to the non-inverting input ends thereof (the gates of the transistors 101, 103) and the output voltage Vout is fed back to the inverting input ends thereof (the gates of the transistors 102 and 104). Accordingly, in the differential amplifier of FIG. 13, the first and second differential pairs both contribute to the slew-rate and therefore the slew-rate is elevated and operation speeded up in comparison with an arrangement in which only one of the first and second differential pairs is placed in a feedback connection. The output voltage Vout at this time is amplified and output with the voltage V(T3) containing an offset.

Next, in time period t1, switches SW1, SW3, SW4 and SW6 are turned ON and switches SW2 and SW5 are turned OFF. Control at this time is similar to that in time period t1 of FIG. 2 in the differential amplifier of FIG. 1. Operation in this time period is similar to that of FIG. 1. In FIG. 13, however, voltage Vref=V(T3) holds and therefore output voltage Vout is a voltage that has been shifted from voltage V(T3) by delta-V in accordance with Equation (1) above. The output voltage Vout is represented by Equation (16) below.

$$V\text{out} = V(T3) + \text{delta-}V \quad (16)$$

In time period t2, switches SW1, SW3, SW4 and SW6 are turned OFF and switches SW2 and SW5 are turned ON. Control at this time also is similar to that in time period t2 of FIG. 2 in the differential amplifier of FIG. 1. Operation in this time period is similar to that of FIG. 1. The output voltage Vout at this time is represented by Equation (4) above.

That is, even in a case where the differential amplifier of FIG. 13 is made to operate under the switch control illustrated in FIG. 14, the effects of a variance in transistor characteristics, power supply noise and switch noise can be eliminated and highly accurate voltage outputs obtained in a manner similar to that of FIG. 1.

The characterizing feature of the switch control illustrated in FIG. 14 is provision of the time period t0 and causing the first and second differential pairs to contribute to slew-rate, thereby achieving high-speed operation.

Since high-speed operation is achieved in time period t0, the time period t0 can be set to be comparatively short in duration even in a case where a variation in the output voltage Vout is large.

Further, the time period t1 also can be set to be short in duration since the output voltage Vout varies only by a comparatively small potential difference delta-V.

In the case of the switch control shown in FIG. 2, on the other hand, the time period t1 in FIG. 2 must be set long in a case where the change in output voltage Vout is large.

Accordingly, it is possible for the total of the two time periods t0, t1 in FIG. 14 to be set to a time period shorter than the time period t1 in FIG. 2.

It should be noted that the two time periods t0, t1 in FIG. 14, as well as the time period t1 in FIG. 2, correspond to the preparatory time period for offset cancellation. This means that the switch control shown in FIG. 14 also is effective in shortening the preparatory time period for offset cancellation.

Figure 15:
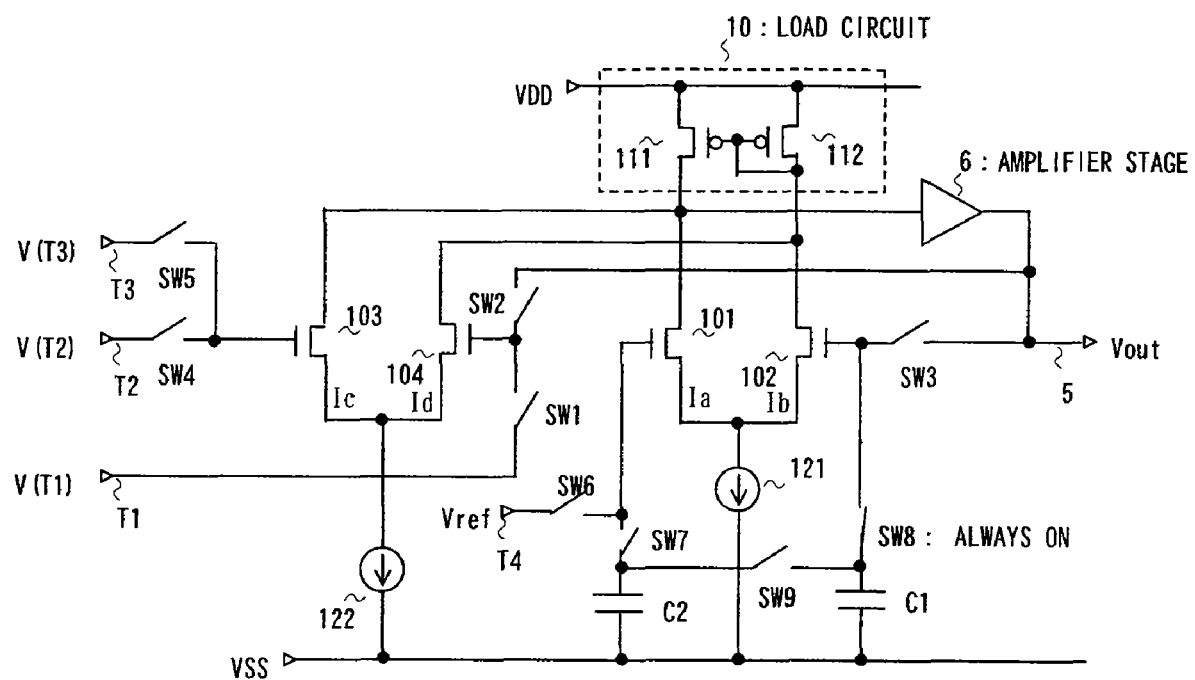
FIG. 15 is a diagram illustrating the structure of a sixth embodiment of the present invention.

FIG. 15 is a diagram illustrating another example of application of the differential amplifier shown in FIG. 1. The embodiment shown in FIG. 15 is an arrangement in which the differential amplifier of FIG. 1 is additionally provided with switches SW7, SW8 and SW9. The switch SW7 is connected between the first end of capacitor C2 and the node of the connection between the gate of transistor 101 of the first differential pair and the switch SW6. The switch SW8 is connected between the first end of capacitor C1 and the node of the connection between the gate of transistor 102 of the first differential pair and the switch SW3. The switch SW9 is connected between the node of switch SW7 and capacitor C2 and the node of switch SW8 and capacitor C1. It should be noted that the switch SW8 is always kept in an ON state.

Figure 16:
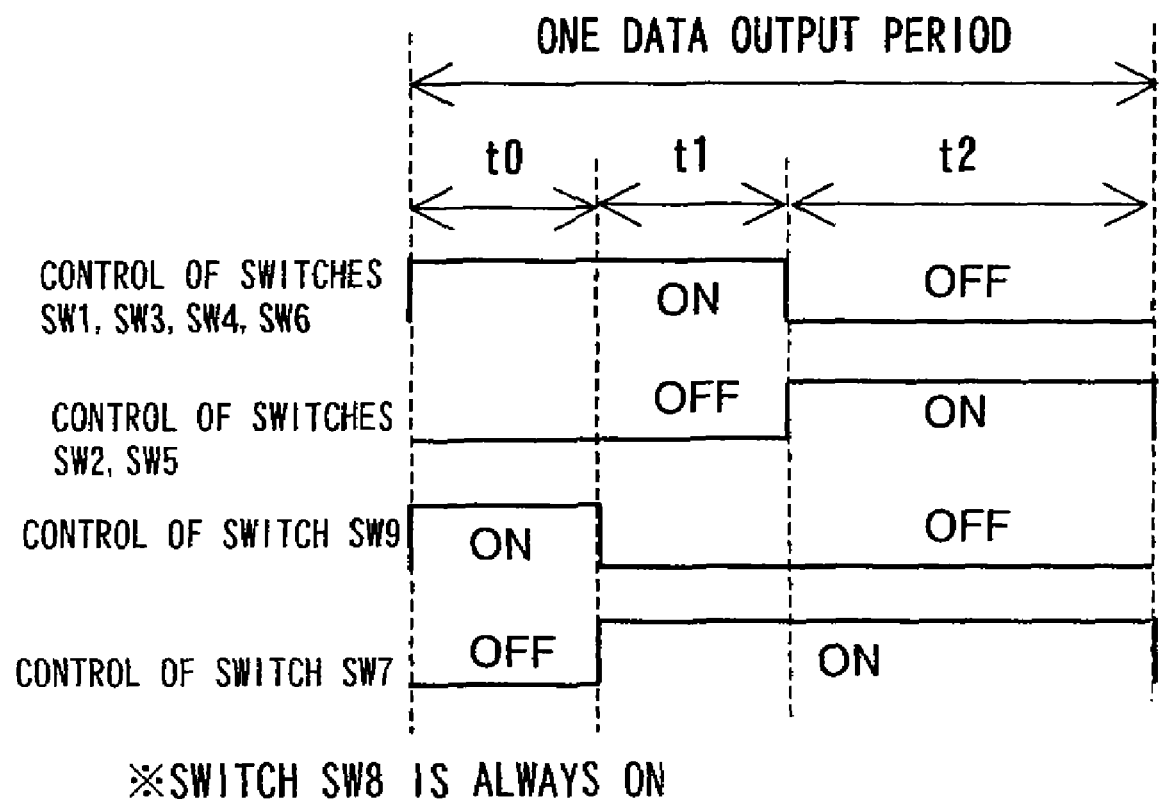
FIG. 16 is a diagram illustrating an example of switch control according to the sixth embodiment.

FIG. 16 is an embodiment of a timing chart indicating ON/OFF control of the switches in the differential amplifier of FIG. 15 in one data output period. Control for diminishing the effects of input impedance owing to capacitor C2 is carried out.

In a case where the differential amplifier of FIG. 1 is such that the reference voltage Vref changes from one output period to the next, it is necessary to externally supply sufficient electric charge to capacitor C2 via terminal T4. This is an arrangement in which input impedance is low. In a case where the reference voltage Vref is made to coincide with any one of the voltages V(T1), V(T2) and V(T3) in the digital-to-analog converter of FIGS. 7, 8 and 9 using the differential amplifying circuit of FIG. 1, the current in the resistor string that generates the voltages V(T1), V(T2) and V(T3) must be increased. This invites an increase in power consumption.

By contrast, the example illustrated in FIGS. 15 and 16 is an example of structure and control capable of suppressing supply of electric charge to the capacitor C2 via the terminal T4.

In FIG. 16, one data output period has been divided into three time periods t0, t1 and t2.

First, in time period t0, the switches SW1, SW3, SW4, SW6 and SW9 are turned ON and the switches SW2, SW5 and SW7 are turned OFF. The state of the connections in FIG. 15 at this time is such that capacitor C2 is cut off from terminal T4 and is connected to capacitor C1 and output terminal 5 via switch SW9. With the exception of the connections of capacitor C2, the state shown in FIG. 15 at this time is equivalent to that in the time period t1 of FIG. 2 in the differential amplifier of FIG. 1.

Accordingly, the output voltage Vout in time period t0 becomes (Vref+delta-V) in Equation (1) above. The amplified and output Vout is supplied to and stored in the capacitors C1 and C2.

Next, in time period t1, switches SW1, SW3, SW4, SW6 and SW7 are turned ON and switches SW2, SW5 and SW9 are turned OFF The state of the connections in FIG. 15 at this time is equivalent to that in time period t1 of FIG. 2 in the differential amplifier of FIG. 1, and operation is similar to that of FIG. 1. Since capacitor C2 is cut off from output terminal 5 and connected to terminal T4 at this time, the voltage stored in capacitor C2 changes from (Vref+delta-V) to Vref. As a result, electric charge for changing the potential difference delta-V is supplied externally to capacitor C2 via terminal T4. Since the potential difference delta-V is comparatively small, the amount of externally supplied electric charge can be made small in comparison with the differential amplifier of FIG. 1.

Next, in time period t2, switches SW1, SW3, SW4, SW6 and SW9 are turned OFF and switches SW2, SW5 and W7 are turned ON. The state of the connections in FIG. 15 at this time is equivalent to that in time period t2 of FIG. 2 in the differential amplifier of FIG. 1, and operation is similar to that of FIG. 1. The output voltage Vout at this time is represented by Equation (4) above.

That is, even in a case where the differential amplifier of FIG. 15 is made to operate under the switch control illustrated in FIG. 16, the effects of variances in transistor characteristics, power supply noise and switch noise can be eliminated and highly accurate voltage output is obtained in a manner similar to that of FIG. 1.

Further in time period t0, the output voltage Vout is stored temporarily in capacitor C2, thereby making it possible to reduce the amount of electric charge externally supplied to capacitor C2 via terminal T4. This means that the increase in power consumption aforementioned in paragraph [0180] can be suppressed in a case where the differential amplifier of FIG. 15 is used as the circuit 30 or 30' of the digital-to-analog converter of FIGS. 7, 8 and 10.

It should be noted that switch SW8 is provided in FIG. 15 in order to suppress the influence of switch noise produced when the switches SW3 and SW6 change from the ON to the OFF state. Since switch noise can be suppressed by making the capacitances of capacitors C1 and C2 or the parasitic capacitances of transistors connected to respective ones of the differential inputs of the first differential pair (101, 102) the same, it is desirable that the switch SW8 provided afford a parasitic capacitance that is the same as the parasitic capacitance of the switch SW7.

Figure 17:
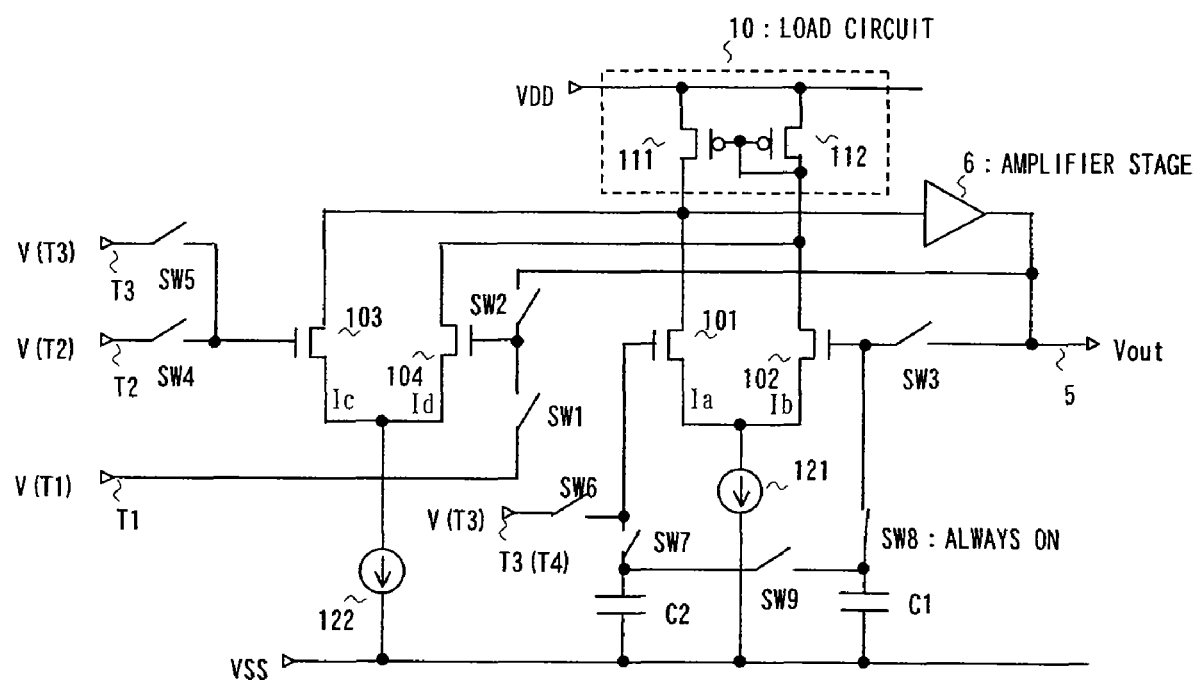
FIG. 17 is a diagram illustrating the structure of a seventh embodiment of the present invention.

FIG. 17 is a diagram illustrating another example of application of the differential amplifier shown in FIG. 1. The embodiment shown in FIG. 17 is an implementation obtained by combining FIGS. 13 and 15. Here the reference voltage Vref that is applied to terminal T4 in FIG. 1 is made to coincide with the voltage V(T3) that is applied to terminal T3, and switches SW7, SW8 and SW9 are added onto the arrangement of FIG. 1. Switch SW7 is connected between the first end of capacitor C2 and the node of the connection between the gate of transistor 101 of the first differential pair and the switch SW6. The switch SW8 is connected between the first end of capacitor C1 and the node of the connection between the gate of transistor 102 of the first differential pair and the switch SW3. The switch SW9 is connected between the node of switch SW7 and capacitor C2 and the node of switch SW8 and capacitor C1. It should be noted that the switch SW8 is always ON.

Figure 18:
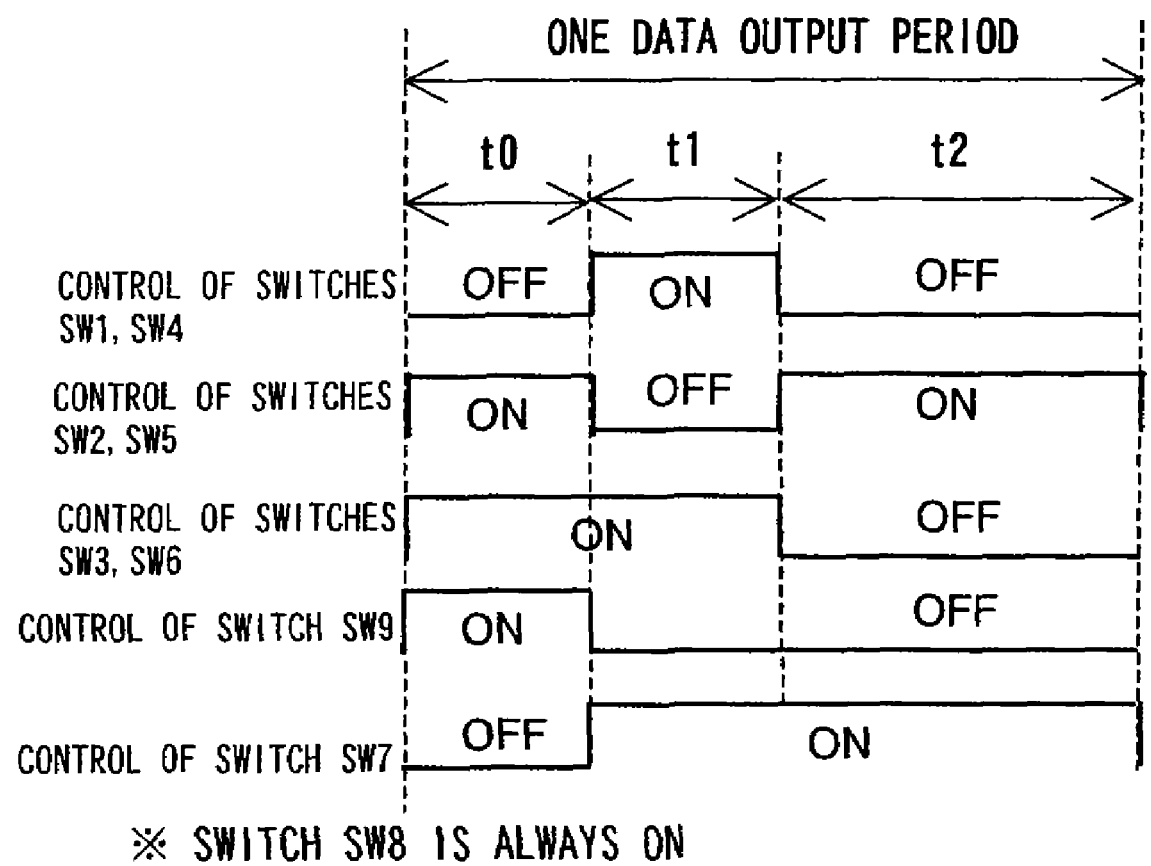
FIG. 18 is a diagram illustrating an example of switch control according to the seventh embodiment.

FIG. 18 is an embodiment of a timing chart indicating ON/OFF control of the switches in the differential amplifier of FIG. 17 in one data output period. The effects of input impedance owing to capacitor C2 are diminished and, by raising the slew-rate, the preparatory period for offset cancellation is shortened.

Operation of the differential amplifier of FIG. 17 under the control shown in FIG. 18 will now be described. In FIG. 18, one data output period has been divided into three time periods t0, t1 and t2.

First, in time period t0, the switches SW1, SW4 and SW7 are turned OFF and the switches SW2, SW3, SW5, SW6 and SW9 are turned ON. The differential amplifier of FIG. 17 at this time is such that the first and second differential pairs are both feedback-connected. The output voltage Vout at this time is amplified and output with the voltage V(T3) containing an offset. The capacitor C2 is connected to the output terminal 5 along with the capacitor C1 and stores the output voltage Vout.

Next, in time period t1, switches SW1, SW3, SW4, SW6 and SW7 are turned ON and switches SW2, SW5 and SW9 are turned OFF. The state of the connections in FIG. 17 at this time is equivalent to that in the time period t1 of FIG. 2 in the differential amplifier of FIG. 1. Operation is similar to that of FIG. 1. In FIG. 17, however, voltage Vref=V(T3) holds and therefore output voltage Vout is given by Equation (16) above. Further, the capacitor C2 is cut off from the output terminal 5 and is connected to the terminal T3 (T4). The voltage stored in capacitor C2, therefore, changes from V(T3), which contains an offset, to the input voltage V(T3). Consequently, the electric charge externally supplied to the capacitor C2 via terminal T3 (T4) need only be the amount of the offset voltage and is extremely small.

Next, in time period t2, switches SW1, SW3, SW4, SW6 and SW9 are turned OFF and switches SW2, SW5 and SW7 are turned ON. The state of the connections in FIG. 17 at this time is equivalent to that in time period t2 of FIG. 2 in the differential amplifier of FIG. 1, and operation is similar to that of FIG. 1. The output voltage Vout at this time is represented by Equation (4) above.

That is, even in a case where the differential amplifier of FIG. 17 is made to operate under the switch control illustrated in FIG. 18, the effects of a variance in transistor characteristics, power supply noise and switch noise can be eliminated and a highly accurate voltage output obtained in a manner similar to that of FIG. 1.

Further, in time period t0, high-speed operation can be achieved by feedback-connecting the first and second differential pairs, and the time period t0 can be set to be comparatively short in duration.

Further, the time period t1 also can be set to be short in duration since the output voltage Vout varies only by a comparatively small potential difference delta-V. As a result, the preparatory period for offset cancellation can be shortened in a manner similar to that in FIGS. 13 and 14.

Further in time period t0, the output voltage Vout is stored temporarily in capacitor C2, thereby making it possible to reduce the amount of electric charge externally supplied to capacitor C2 via terminal T3 (T4). This means that the increase in power consumption aforementioned in paragraph

[0180] can be suppressed in a case where the differential amplifier of FIG. 17 is used as the circuit 30 or 30' of the digital-to-analog converter of FIGS. 7, 8 and 10.

FIGS. 13 to 18 illustrate examples of application of the differential amplifier shown in FIG. 1. However, it goes without saying that similar applications are possible also with respect to the differential amplifiers of FIGS. 9, 11 and 12.

Figure 19:
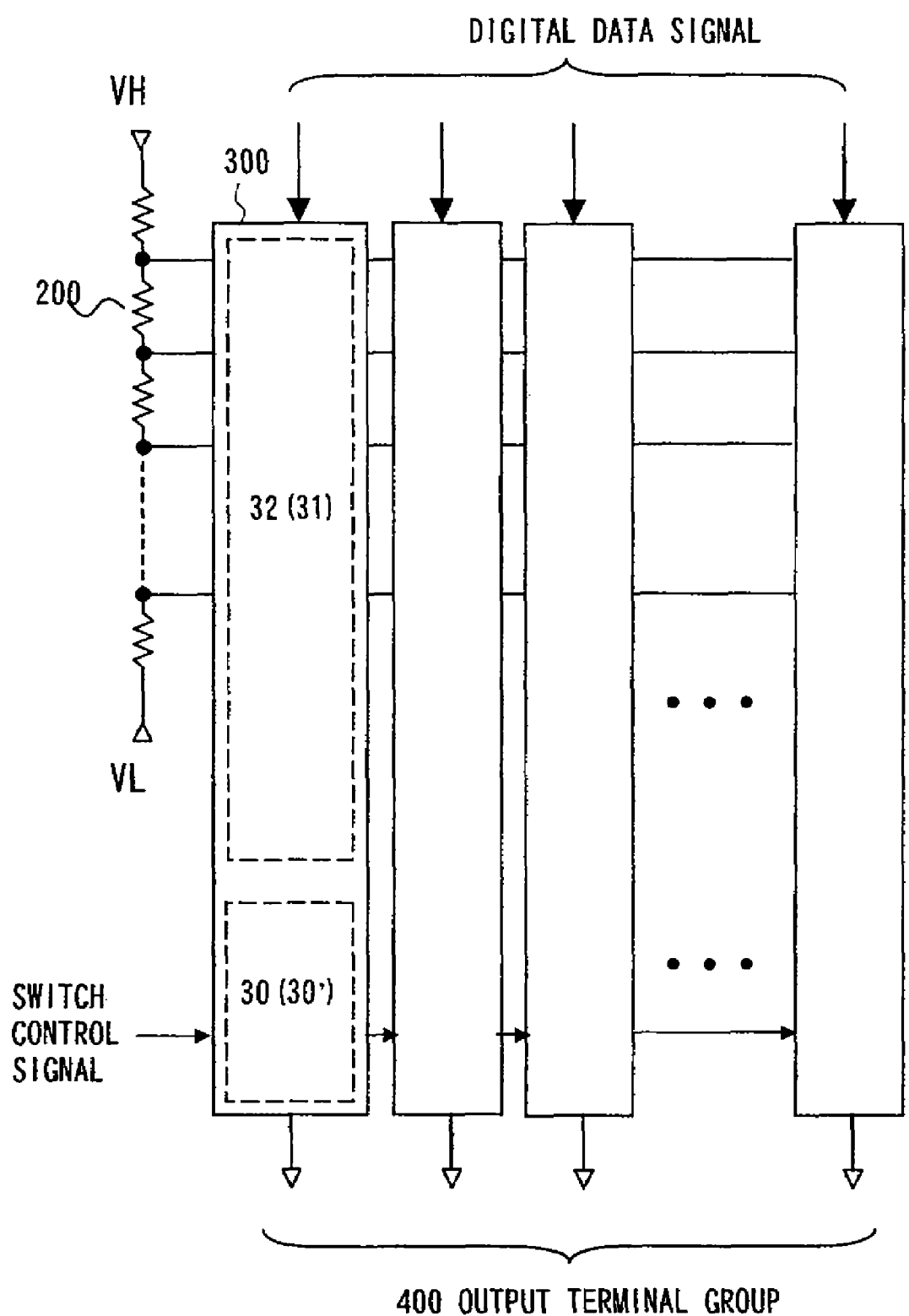
FIG. 19 is a diagram illustrating the structure of a data driver of a display device according to an eighth embodiment of the present invention.

FIG. 19 is a diagram illustrating the structure of a data driver of a display device according to another embodiment of the present invention. This is a diagram illustrating an example in which the digital-to-analog converters of FIGS. 7, 8 and 10 are applied.

As shown in FIG. 19, the data driver of the display device depicted in FIG. 19 includes at least a grayscale voltage generating circuit 200, which comprises a resistor string composed of a plurality of resistance elements, a plurality of digital-to-analog converters 300. Each digital-to-analog converter 300 has a decoder such as the switch group 31 or 32 of FIGS. 7, 8 and 10, and the differential amplifier 30 or 30' illustrated in any one of FIGS. 1, 9, 11, 12, 13, 15, and 17. The decoder selects the voltages V(T1), V(T2) and V(T3) in accordance with the video digital data signal and inputs the selected voltages to the differential amplifier 30. Alternatively, the decoder selects the voltages V(T1) and V(T2) in accordance with the video digital data signal and inputs the selected voltages to the differential amplifier 30'. Further, the differential amplifier is such that the switches are controlled by a control signal that is common to each digital-to-analog converter 300.

Figure 20:
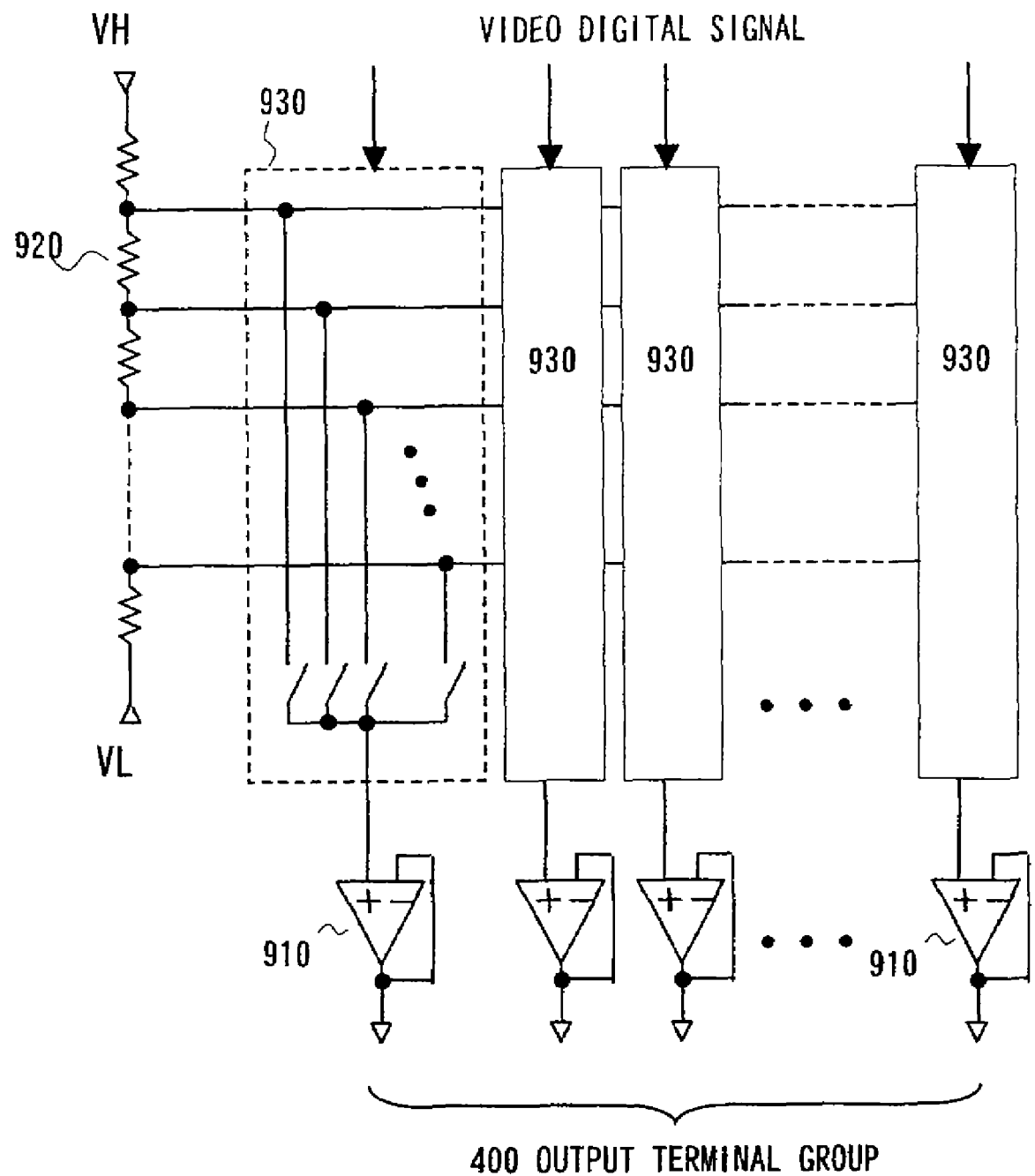
FIG. 20 is a diagram illustrating the structure of a data driver of a display device according to the prior art.

The data driver illustrated in FIG. 19 comprises differential amplifiers and digital-to-analog converters according to the present invention and is capable of producing multi-level outputs. As a result, the number of grayscale voltages produced by the grayscale voltage generating circuit 200 can be reduced in comparison with the arrangement of FIG. 20 and the scale of the circuitry of each decoder can be reduced This makes it possible to reduce area, i.e., to lower cost. Naturally, the cost of a display device using the data driver of FIG. 19 can be reduced.

Further, each differential amplifier eliminates the influence of a variance in transistor characteristics, power supply noise and switch noise, etc., and is capable of outputting highly accurate voltages.

It should be noted that the data driver of the present invention is not limited to a display device and is also capable of being used as a high-performance multiple-output driver.

Though the present invention has been described in accordance with the foregoing embodiments, the invention is not limited to these embodiments and it goes without saying that the invention covers various modifications and changes that would be obvious to those skilled in the art within the scope of the claims. The invention may be realized by an LSI using monocrystalline silicon as a matter of course, and by a circuit using thin-film transistors (TFTs) formed on an insulating substrate such as glass.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A differential amplifier comprising:
   an input differential stage that includes first and second differential pairs and a load circuit commonly connected to output pairs of said first and second differential pairs;
   an amplifier stage for receiving a common output signal of said first and second differential pairs and for driving an output terminal by a charging or discharging operation; and
   a control circuit for controlling switching between at least two states including:
   a first state in which the output terminal is feedback-connected to a first differential input of said first differential pair; a reference voltage is supplied to a second differential input of said first differential pair; a voltage at the output terminal and the reference voltage supplied to the first and second differential inputs of said first differential pair are stored in first and second capacitors, respectively, connected to the first and second differential inputs of said first differential pair; and first and second voltages are supplied to first and second differential inputs, respectively, of said second differential pair; and
   a second state in which the output terminal is feedback-connected to the first differential input of said second differential pair; a third voltage is supplied to the second differential input of said second differential pair; the first and second differential inputs of said first differential pair are cut off from the output terminal and a supply terminal of the reference voltage; and voltages that have been stored in the first and second capacitors are supplied to the first and second differential inputs, respectively, of said first differential pair.

2. The differential amplifier according to claim 1, wherein the reference voltage comprises the third voltage; and
   said control circuit controls switching among a third state and the first and second states, wherein the third state is a state in which the voltage at the output terminal is fed back and supplied to the first differential input of each of said first and second differential pairs and the third voltage is supplied to the second differential input of each of said first and second differential pairs.

3. The differential amplifier according to claim 1, wherein the first and second capacitors have first ends connected to the first and second differential inputs, respectively, of said first differential pair, and second ends commonly connected to a power-supply terminal or to a terminal that supplies a prescribed voltage.

4. The differential amplifier according to claim 1, wherein the reference voltage is equal to any one of the first, second and third voltages.

5. The differential amplifier according to claim 1, wherein the first and third voltages are equal and the reference voltage is equal to the first or second voltage.

6. The differential amplifier according to claim 1, wherein said amplifier stage comprises a differential amplifying circuit having an input pair connected to first and second common connection nodes of output pairs of said first and second differential pairs, and an output end connected to the output terminal.

7. A differential amplifier comprising:
   an input differential stage that includes first and second differential pairs and a load circuit commonly connected to output pairs of said first and second differential pairs;
   an amplifier stage for receiving a common output signal of said first and second differential pairs and for driving an output terminal by a charging or discharging operation;

a control circuit for controlling signal input to differential inputs of said first differential pair and to differential inputs of said second differential pair; and first and second capacitors having first ends thereof connected to first and second differential inputs, respectively, of said first differential pair;

wherein a data output period includes first and second time periods; and control is exercised by said control circuit in such a manner that:

in the first time period, a voltage at the output terminal and a reference voltage are supplied to first and second differential inputs, respectively, of said first differential pair; the voltage at the output terminal and the reference voltage are stored in said first and second capacitors, respectively; and first and second voltages are supplied to respective ones of first and second differential inputs of said second differential pair; and in the second time period, the first and second differential inputs of said first differential pair are cut off from the voltage at the output terminal and cut off from supply of the reference voltage, and are supplied with voltages stored in said first and second capacitors, respectively; and the first and second differential inputs of said second differential pair are supplied with the voltage at the output terminal and with the third voltage.

8. The differential amplifier according to claim 7, wherein said control circuit includes:

a first switch connected between the first differential input of said second differential pair and a first terminal that supplies the first voltage;

a second switch connected between the first differential input of said second differential pair and the output terminal, respectively;

a third switch connected between the first differential input of said first differential pair and the output terminal;

a fourth switch connected between the second differential input of said second differential pair and a second terminal that supplies the second voltage;

a fifth switch connected between the second differential input of said second differential pair and a third terminal that supplies the second voltage; and a sixth switch connected between the second differential input of said first differential pair and a fourth terminal that supplies the reference voltage;

wherein in the first time period, the second and fifth switches are set in an OFF state; the voltage at the output terminal and the reference voltage are supplied to the first and second differential inputs of said first differential pair via said third and sixth switches, respectively, which are in an ON state; and the first and second voltages are supplied to the first and second differential inputs of said second differential pair via said first and fourth switches, respectively, which are in an ON state; and in the second time period, said first, third, fourth and sixth switches are all set in an OFF state, and the voltage at the output terminal and the third voltage are supplied to the first and second differential inputs of said second differential pair via said second and fifth switches, respectively, which are in an ON state.

9. The differential amplifier according to claim 7, wherein the reference voltage is made the third voltage and the data output period has a preparatory drive period that is earlier than the first time period; and in the preparatory drive period, the third voltage is supplied to the second differential inputs of the first and second differential pairs, and the voltage at the output terminal is fed back to the first differential inputs of said first and second differential pairs.

10. The differential amplifier according to claim 7, wherein said control circuit includes:

a first switch connected between the first differential input of said second differential pair and a first terminal that supplies the first voltage;

a second switch connected between the first differential input of said second differential pair and the output terminal;

a third switch connected between the first differential input of said first differential pair and the output terminal;

a fourth switch connected between the second differential input of said second differential pair and a second terminal that supplies the second voltage;

a fifth switch connected between the second differential input of said second differential pair and a third terminal that supply the third voltage; and a sixth switch connected between the second differential input of said first differential pair and a fourth terminal that supplies the reference voltage;

wherein the reference voltage is made the third voltage and the data output period has a preparatory drive period that is earlier than the first time period;

in the preparatory drive period, the first and fourth switches are set in an OFF state; the third voltage is supplied to the second differential inputs of said first and second differential pairs via the sixth and fifth switches, respectively, which are in an ON state, and the voltage at the output terminal is fed back and supplied to the first differential inputs of said first and second differential pairs via the third and second switches, respectively, which are in an ON state;

in the first time period, the second and fifth switches are set in an OFF state; the voltage at the output terminal and the third voltage are supplied to the first and second differential inputs of said first differential pair via the third and sixth switches, respectively, which are in an ON state; and the first and second voltages are supplied to the first and second differential inputs of said second differential pair via the first and fourth switches, respectively, which are in an ON state; and in the second time period, the first, third, fourth and sixth switches are all set in an OFF state, and the voltage at the output terminal and the third voltage are supplied to the first and second differential inputs of said second differential pair via the second and fifth switches, respectively, which are in an ON state.

11. The differential amplifier according to claim 7, wherein the data output period has a preparatory drive period that is earlier than the first time period; and in the preparatory drive period, said second capacitor is cut off from the second differential input of said first differential pair to which the reference voltage is supplied, and is short-circuited to said first capacitor and the voltage at the output terminal is stored in each of said first and second capacitors.

12. The differential amplifier according to claim 7, wherein said control circuit includes:

a first switch connected between the first differential input of said second differential pair and a first terminal that supplies the first voltage;

a second switch connected between the first differential input of said second differential pair and the output terminal;

a third switch connected between the first differential input of said first differential pair and the output terminal;

a fourth switch connected between the second differential input of said second differential pair and a second terminal that supplies the second voltage;

a fifth switch connected between the second differential input of said second differential pair and a third terminal that supplies the third voltage;

a sixth switch connected between the second differential input of said first differential pair and a fourth terminal that supplies the reference voltage;

a seventh switch connected between the second differential input of said first differential pair and the first end of said second capacitor; and an eighth switch connected between the first end of said first capacitor and the first end of said second capacitor;

wherein the data output period has a preparatory drive period that is earlier than the first time period;

in the preparatory drive period, said second, fifth and seventh switches are set in an OFF state; the voltage at the output terminal is supplied to the first differential input of said first differential pair; the reference voltage is supplied to the second differential input of said first differential pair via said sixth switch, which is in an ON state; said first and second voltages are supplied to respective ones of the differential inputs of said second differential pair via said first and fourth switches, respectively; and the first end of said first capacitor and the first end of said second capacitor are supplied commonly with the voltage at the output terminal via the third and eighth switches, which are in an ON state;

in the first time period, the second, fifth and eighth switches are all set in an OFF state; the second capacitor is connected to the second differential input of said first differential pair and is supplied with the reference voltage via the seventh switch, which is in an ON state; and in the second time period, the first, third, fourth and eighth switches are all set in an OFF state, and the voltage at the output terminal and the third voltage are supplied to respective ones of the differential inputs of said second differential pair via said second and fifth switches, respectively, which are in an ON state.

13. The differential amplifier according to claim 9, wherein in the preparatory drive period, said second capacitor is cut off from the second differential input of said first differential pair supplied with the reference voltage, said first capacitor is short-circuited and the voltage at the output terminal is stored in each of said first and second capacitors.

14. The differential amplifier according to claim 7, wherein said control circuit includes:

a first switch connected between the first differential input of said second differential pair and a first terminal that supplies the first voltage;

a second switch connected between the first differential input of said second differential pair and the output terminal;

a third switch connected between the first differential input of said first differential pair and the output terminal;

a fourth switch connected between the second differential input of said second differential pair and a second terminal that supplies the second voltage;

a fifth switches connected between the second differential input of said second differential pair and a third terminal that supplies the third voltage;

a sixth switch connected between the second differential input of the first differential pair and a fourth terminal that supplies the reference voltage;

a seventh switch connected between the second differential input of said first differential pair and the first end of said second capacitor; and an eighth switch connected between the first end of said first capacitor and the first end of said second capacitor;

wherein the reference voltage is made the third voltage and the data output period has a preparatory drive period that is earlier than the first time period;

in the preparatory drive period, the first, fourth and seventh switches are set in an OFF state; the voltage at the output terminal is fed back and supplied to the first differential inputs of said first and second differential pairs via said third and second switches, respectively, which are in an ON state; the third voltage is supplied to the second differential inputs of said first and second differential pairs via said sixth and fifth switches, respectively, which are in an ON state; and the voltage at the output terminal is supplied commonly to said first and second capacitors via the third and eighth switches, which are in an ON state;

in the first time period, said second, fifth and eighth switches are all set in an OFF state; the voltage at the output terminal and the third voltage are supplied to the first and second differential inputs of said first differential pair via said third and sixth switches, respectively, which are in an ON state; the first and second voltages are supplied to the first and second differential inputs of said second differential pair via said first and fourth switches, respectively, which are in an ON state; said second capacitor is connected to the second differential input of said first differential pair and is supplied with the third voltage via said seventh switch, which is in an ON state; and in the second time period, said first, third, fourth and eighth switches are all set in an OFF state, and the voltage at the output terminal and the third voltage are supplied to the first and second differential inputs of said second differential pair via said second and fifth switches, respectively, which are in an ON state.

15. The differential amplifier according to claim 12, further comprising a ninth switch, which is in an ON state, connected between the first differential input of said first differential pair and the first end of said first capacitor.

16. The differential amplifier according to claim 7, wherein the reference voltage comprises any one voltage among the first, second and third voltages in the data output period.

17. The differential amplifier according to claim 7, wherein the voltage at the output terminal in the second time period is a voltage obtained by adding or subtracting a difference voltage between the first and second voltages to or from the third voltage.

18. The differential amplifier according to claim 7, wherein the third voltage comprises the first or second voltage in the data output period.

19. A differential amplifier comprising:

first and second differential pairs of a first polarity;

a first load circuit of a second polarity commonly connected to said first and second differential pairs;

first and second current sources for supplying current to said first and second differential pairs, respectively;

third and fourth differential pairs of the second polarity;

a second load circuit of the first polarity commonly connected to said third and fourth differential pairs;

third and fourth current sources for supplying current to said third and fourth differential pairs, respectively;

a first amplifier stage for receiving a common output signal of said first and second differential pairs and having an output connected to an output terminal;

a second amplifier stage for receiving a common output signal of said third and fourth differential pairs and having an output connected to the output terminal;

a control circuit for controlling signal input to said first to fourth differential pairs;

first and second differential inputs of said first differential pair being connected to first and second differential inputs of said third differential pair, respectively;

first and second differential inputs of said second differential pair being connected to first and second differential inputs of said fourth differential pair, respectively; and first and second capacitors having first ends connected to first and second common connection nodes of the first and second differential inputs of said first and third differential pairs, respectively;

wherein a data output period includes first and second time periods;

in the first time period, a voltage at the output terminal and a reference voltage are supplied to the first and second differential inputs of the first and third differential pairs; the voltage at the output terminal and the reference voltage are stored in the first and second capacitors, respectively, connected to the first and second differential inputs of said first and third differential pairs; and first and second voltages are supplied to the first and second differential inputs of said second and fourth differential pairs; and in the second time period, the first and second differential inputs of said first and third differential pairs are cut off from supply of the voltage at the output terminal and of the reference voltage, and are supplied with voltages stored in said first and second capacitors, respectively; and the first and second differential inputs of said second and fourth differential pairs are supplied with the voltage at the output terminal and with a third voltage.

20. The differential amplifier according to claim 19, wherein said control circuit includes:

a first switch connected between a third common connection node of the first differential inputs of said second and fourth differential pairs and a first terminal that supplies the first voltage;

a second switch connected between the third common connection node of the first differential inputs of said second and fourth differential pairs and the output terminal;

a third switch connected between the first common connection node of the first differential inputs of said first and third differential pairs and the output terminal;

a fourth switch connected between a fourth common connection node of the second differential inputs of said second and fourth differential pairs and a second terminals that supplies the second voltage;

a fifth switch connected between the fourth common connection node of the second differential inputs of said second and fourth differential pairs and a third terminal that supplies the third voltage; and a sixth switch connected between the second common connection node of the second differential inputs of said first and third differential pairs and a fourth terminal that supplies the reference voltage; and wherein in the first time period, said second and fifth switches are set in an OFF state; the voltage at the output terminal and the reference voltage are supplied to the first and second differential inputs of said first and third differential pairs via said third and sixth switches, respectively, which are in an ON state; and the first and second voltages are supplied to the first and second differential inputs of the second and fourth differential pairs via said first and fourth switches, respectively, which are in an ON state; and in the second time period, said first, third, fourth and sixth switches are all set in an OFF state, and the voltage at the output terminal and the third voltage are supplied to the first and second differential inputs of said second and fourth differential pairs via said second and fifth switches, respectively, which are in an ON state.

21. A digital-to-analog converter comprising:

the differential amplifier as set forth in claim 1;

a group of resistors connected serially between a first potential on a high potential side and a second potential on a low potential side for outputting a number of level voltages and first and second reference voltages from taps thereof; and a decoder for selecting the first and second voltages from the first and second reference voltages and selecting the third voltage from the a number of level voltages based upon a data signal, and supplying the first, second and third voltages to said differential amplifier.

22. A digital-to-analog converter comprising:

the differential amplifier as set forth in claim 1;

a group of resistors connected serially between a first potential on a high potential side and a second potential on a low potential side for outputting a number of level voltages from taps thereof; and a decoder for selecting the first, second and third voltages from the a number of level voltages based upon a data signal, and supplying the first, second and third voltages to said differential amplifier.

23. The digital-to-analog converter according to claim 22, wherein the third voltage comprises the first or second voltage.

24. A data driver comprising a plurality of the digital-to-analog converters as set forth in claim 21;

wherein voltages that are output from the group of resistors and taps are shared by said plurality of digital-to-analog converters.

25. A data driver comprising a plurality of the digital-to-analog converters as set forth in claim 22;

wherein voltages that are output from the group of resistors and taps are shared by said plurality of digital-to-analog converters.

26. A display device comprising an amplifying circuit for receiving a grayscale voltage and for driving a data line connected to display elements;

wherein said amplifying circuit comprises the differential amplifier as set forth in claim 1.

* * * * *